(12) United States Patent
Yu et al.

(10) Patent No.: US 11,955,950 B2
(45) Date of Patent: Apr. 9, 2024

(54) FORMATION METHOD OF FILTER DEVICE

(71) Applicant: SHENZHEN SUNWAY COMMUNICATION CO., LTD., Guangdong (CN)

(72) Inventors: Chengcheng Yu, Shenzhen (CN); Yanjie Cao, Shenzhen (CN); Wei Wang, Shenzhen (CN)

(73) Assignee: SHENZHEN SUNWAY COMMUNICATION CO., LTD., Shenzhen (CN)

(*) Notice: Subject to any disclaimer, the term of this patent is extended or adjusted under 35 U.S.C. 154(b) by 925 days.

(21) Appl. No.: 16/940,962

(22) Filed: Jul. 28, 2020

(65) Prior Publication Data
US 2021/0336603 A1 Oct. 28, 2021

Related U.S. Application Data

(63) Continuation of application No. PCT/CN2020/090947, filed on May 19, 2020.

(30) Foreign Application Priority Data

Apr. 26, 2020 (CN) .......................... 202010336622.7

(51) Int. Cl.
H03H 3/08 (2006.01)
H03H 3/02 (2006.01)
(Continued)

(52) U.S. Cl.
CPC .............. *H03H 9/542* (2013.01); *H03H 3/02* (2013.01); *H03H 3/08* (2013.01); *H03H 9/173* (2013.01);
(Continued)

(58) Field of Classification Search
CPC .......... H03H 9/542; H03H 9/25; H03H 9/564; H03H 3/02; H03H 3/08; Y10T 29/49128; Y10T 29/4913; Y10T 29/49155
See application file for complete search history.

(56) References Cited

U.S. PATENT DOCUMENTS 8,209,826 B2 * 7/2012 Handtmann ........... H03H 9/584
29/25.35
8,782,876 B1 7/2014 Kubena et al.
(Continued)

FOREIGN PATENT DOCUMENTS

| CN | 103138709 A | 6/2013 |
| CN | 103560763 A | 2/2014 |

(Continued)

OTHER PUBLICATIONS

Sep. 24, 2021 Office Action issued in Chinese Patent Application No. 202010336622.7.
(Continued)

*Primary Examiner* — Donghai D Nguyen
(74) *Attorney, Agent, or Firm* — Oliff PLC

(57) ABSTRACT

A formation method of a filter device includes: forming a first layer by providing a first substrate and forming a resonance device preprocessing layer with a first side and a second side opposite to the first side, wherein the first substrate is located on the first side; forming a second layer by providing a second substrate and forming a first passive device with a third side and a fourth side opposite to the third side, wherein the second substrate is located on the third side; connecting the first layer located on the fourth side and the second layer located on the second side; removing the first substrate; and forming at least one first resonance device based on the resonance device preprocessing layer. The resonance device and the passive device are integrated (Continued)

in one die to form a filter device, which requires less space in an RF front-end chip.

18 Claims, 15 Drawing Sheets

(51) Int. Cl.
    *H03H 9/17*     (2006.01)
    *H03H 9/25*     (2006.01)
    *H03H 9/54*     (2006.01)
    *H03H 9/56*     (2006.01)
    *H03H 9/64*     (2006.01)

(52) U.S. Cl.
    CPC .............. *H03H 9/175* (2013.01); *H03H 9/25* (2013.01); *H03H 9/564* (2013.01); *H03H 9/64* (2013.01); *H03H 2003/021* (2013.01); *H03H 2003/025* (2013.01)

(56) References Cited

U.S. PATENT DOCUMENTS

| | | | |
|---|---|---|---|
| 10,559,743 B2* | 2/2020 | Adkisson | H01L 24/24 |
| 11,233,493 B2* | 1/2022 | Timme | H10N 30/057 |
| 2016/0190206 A1 | 6/2016 | Tsai et al. | |
| 2017/0365775 A1 | 12/2017 | Adkisson et al. | |
| 2018/0069528 A1 | 3/2018 | Qiu et al. | |
| 2018/0197755 A1 | 7/2018 | Hsu et al. | |
| 2018/0309425 A1 | 10/2018 | Shealy et al. | |

FOREIGN PATENT DOCUMENTS

| | | |
|---|---|---|
| CN | 107528561 A | 12/2017 |
| CN | 108259017 A | 7/2018 |
| CN | 108512520 A | 9/2018 |
| CN | 108696263 A | 10/2018 |
| CN | 110649905 A | 1/2020 |
| CN | 110676287 A | 1/2020 |
| DE | 10 2017 130 924 B3 | 5/2019 |
| EP | 1 111 780 A3 | 7/2001 |
| IN | 109981069 A | 7/2019 |
| TW | 202013889 A | 4/2020 |

OTHER PUBLICATIONS

Jan. 27, 2021 Search Report issued in International Patent Application No. PCT/CN2020/090947.
May 31, 2022 Office Action Issued in Chinese Patent Application No. 202010336622.7.
Feb. 16, 2022 Office Action Issued in Chinese Patent Application No. 202010336622.7.

* cited by examiner

100

| Form a first layer through the following steps: (1) providing a first substrate; (2) forming a resonance device preprocessing layer for forming at least one first resonance device (such as an SAW resonance device or a BAW resonance device), wherein the resonance device preprocessing layer has a first side and a second side opposite to the first side, and the first substrate is located on the first side; | S101 |

⇩

| Form a second layer through the following steps: (1) providing a second substrate; (2) forming a first passive device (such as an IPD), wherein the first passive device has a third side and a fourth side opposite to the third side, and the second substrate is located on the third side; | S103 |

⇩

| Connect the first layer and the second layer, wherein the first layer is located on the fourth side, and the second layer is located on the second side; | S105 |

⇩

| Remove the first substrate; | S107 |

⇩

| Form the at least one first resonance device based on the resonance device preprocessing layer; | S109 |

Form a third layer through the following steps: (1) providing a third substrate; (2) forming a second piezoelectric layer located on the third substrate; (3) forming a third electrode layer located on the second piezoelectric layer; (4) forming a cavity preprocessing layer which is located on the second piezoelectric layer and used for forming a second cavity and at least covers a first terminal of the third electrode layer, wherein a fifth side of the third layer corresponds to the third substrate, and a sixth side of the third layer corresponds to the cavity preprocessing layer; — S201

⇩

Form a fourth layer through the following steps: (1) providing a fourth substrate; (2) forming a second passive device, wherein the second passive device has a seventh side and an eighth side opposite to the seventh side, and the fourth substrate is located on the seventh side; — S203

⇩

Connect the third layer and the fourth layer, wherein the third layer is located on the eighth side, and the fourth layer is located on the sixth side; — S205

⇩

Remove the third substrate, wherein the fifth side corresponds to the second piezoelectric layer; — S207

⇩

Form at least one second resonance device through the following steps: (1) forming a fourth electrode layer which is located on the fifth side and contacts with the second piezoelectric layer, wherein the third electrode layer and the fourth electrode layer are respectively located on two sides of the second piezoelectric layer; (2) forming the second cavity based on the cavity preprocessing layer; — S209

FIG. 2

FORMATION METHOD OF FILTER DEVICE

TECHNICAL FIELD

The invention relates to the technical field of semiconductors, in particular to a formation method of a filter device.

Description of Related Art

The radio frequency (RF) front-end chip of wireless communication equipment includes a power amplifier, a low-noise amplifier, an antenna switch, an RF filter, a multiplexer, and the like, wherein the RF filter is a surface acoustic wave (SAW) filter, a bulk acoustic wave (BAW) filter, a micro-electro-mechanical system (MEMS) filter, an integrated passive devices (IPD) filter, or the like.

SAW resonators and BAW resonators have a high quality factor value (Q value) and are used to manufacture RF filters with a low insertion loss and a high-out-of-band rejection. Wherein, Q value refers to the quality factor value of the resonators and is defined as a value obtained by dividing the center frequency by 3 dB bandwidth of the resonators. The filters manufactured from the SAW resonators and the BAW resonators have a limited pass-band width due to the restrictions of the electromechanical coupling coefficient of piezoelectric materials. IPDs have a broader pass-band width than the SAW filters and the BAW filters.

Filters integrating resonators (such as SAW resonators or BAW resonators) and IPDs can broaden the pass-band width and have a high out-of-band rejection. However, electrical connection of one resonator and one IPD (for example, the ASW or BAW resonator is located in a die, and the IPD is located in another die) will occupy more space in the RF front-end chip and will increase the manufacturing cost. With the rise of 5G, the RF front-end chip may comprise more RF front-end modules each including multiple RF filters, while the size of the chip has to be further decreased, and thus, space optimization has become an important factor taken into consideration when the RF filters are designed.

BRIEF SUMMARY OF THE INVENTION

The issue to be settled by the invention is to provide a formation method of a filter device, which can optimize the pass-band width, has a high out-of-band rejection and occupies less space in an RF front-end chip.

To settle the aforesaid issue, an embodiment of the invention provides a formation method of a filter device, which comprises: forming a first layer through the following steps: providing a first substrate and forming a resonance device preprocessing layer, wherein the resonance device preprocessing layer has a first side and a second side opposite to the first side, and the first substrate is located on the first side; forming a second layer through the following steps: providing a second substrate and forming a first passive device, wherein the first passive device has a third side and a fourth side opposite to the third side, and the second substrate is located on the third side; connecting the first layer and the second layer, wherein the first layer is located on the fourth side, and the second layer is located on the second side; removing the first substrate; and forming at least one first resonance device based on the resonance device preprocessing layer. The second substrate, the first passive device and the at least one first resonance device are located in a die. The at least one first resonance device is electrically connected to the first passive device.

In some embodiments, the step of forming the first passive device comprises: forming at least one of a capacitor, an inductor, a resistor and a through hole. In some embodiments, the first passive device includes a first IPD, wherein the first IPD is formed through a semiconductor process.

In some embodiments, the step of connecting the first layer and the second layer comprises: connecting the resonance device preprocessing layer and the first passive device.

In some embodiments, the at least one first resonance device includes at least one of an SAW resonance device and a BAW resonance device.

In some embodiments, the step of forming the resonance device preprocessing layer comprises: forming an active preprocessing layer which is located on the first substrate, and forming a reflection preprocessing layer which is located on the active preprocessing layer, wherein the first side corresponds to the active preprocessing layer, and the second side corresponds to the reflection preprocessing layer. In some embodiments, the step of connecting the first layer and the second layer comprises: connecting the reflection preprocessing layer and the first passive device. In some embodiments, the step of forming at least one first resonance device comprises: forming a first active layer of the at least one first resonance device based on the active preprocessing layer, and forming a first reflection layer of the at least one first resonance device based on the reflection preprocessing layer to reflect acoustic waves generated by the first active layer.

In some embodiments, the step of forming the active preprocessing layer comprises: forming a first piezoelectric layer which is located on the first substrate, and forming a first electrode layer which is located on the first piezoelectric layer, wherein the first side corresponds to the first piezoelectric layer. In some embodiments, the step of forming at least one first resonance device comprises: forming a second electrode layer which is located on the first side and contacts with the first piezoelectric layer, wherein the first electrode layer and the second electrode layer are respectively located on two sides of the first piezoelectric layer to form a second active layer of the at least one first resonance device; and forming a second reflection layer of the at least one first resonance device based on the reflection preprocessing layer to reflect acoustic waves generated by the second active layer.

In some embodiments, the step of forming the reflection preprocessing layer comprises: forming a first sacrificial layer which is located on the active preprocessing layer, and forming a first intermediate layer which is located on the active preprocessing layer and at least covers the first sacrificial layer, wherein the second side corresponds to the first intermediate layer. In some embodiments, the first intermediate layer is made of at least one of the following materials: polymer, insulating dielectric and polysilicon. In some embodiments, the step of connecting the first layer and the second layer comprises: connecting the first intermediate layer and the first passive device. In some embodiments, the step of forming at least one first resonance device comprises: forming a third active layer of the at least one first resonance device based on the active preprocessing layer, and removing the first sacrificial layer to form a first cavity of the at least one first resonance device to reflect acoustic waves generated by the third active layer.

In some embodiments, the step of forming the second layer further comprises: forming a second intermediate layer which is located on the fourth side. In some embodiments, the second intermediate layer is made of at least one of the following materials: polymer, insulating dielectric and polysilicon. In some embodiments, the step of connecting the first layer and the second layer comprises: bonding the first intermediate layer and the second intermediate layer to form a third intermediate layer.

An embodiment of the invention further provides a formation method of a filter device, which comprises: forming a third layer through the following steps: providing a third substrate, forming a second piezoelectric layer located on the third substrate, forming a third electrode layer located on the second piezoelectric layer, forming a cavity preprocessing layer which is located on the second piezoelectric layer and used for forming a second cavity and at least covers a first terminal of the third electrode layer, wherein a fifth side of the third layer corresponds to the third substrate, and a sixth side of the third layer corresponds to the cavity preprocessing layer; forming a fourth layer through the following steps: providing a fourth substrate, and forming a second passive device, wherein the second passive device has a seventh side and an eighth side opposite to the seventh side, and the fourth substrate is located on the seventh side; connecting the third layer and the fourth layer, wherein the third layer is located on the eighth side, and the fourth layer is located on the sixth side; removing the third substrate, wherein the fifth side corresponds to the second piezoelectric layer; and forming at least one second resonance device through the following steps: forming a fourth electrode layer which is located on the fifth side and contacts with the second piezoelectric layer, wherein the third electrode layer and the fourth electrode layer are respectively located on two sides of the second piezoelectric layer. The fourth substrate, the second passive device and the at least one second resonance device are located in a die. The at least one second resonance device is electrically connected to the second passive device.

In some embodiments, the step of forming the second passive device comprises: forming at least one of a capacitor, an inductor, a resistor and a through hole. In some embodiments, the second passive device includes a second IPD, wherein the second IPD is formed through a semiconductor process.

In some embodiments, the step of connecting the third layer and the fourth layer comprises: connecting the cavity preprocessing layer and the second passive device.

In some embodiments, the step of forming the cavity preprocessing layer comprises: forming a second sacrificial layer which is located on the second piezoelectric layer and at least covers the first terminal, and forming a fourth intermediate layer which is located on the second piezoelectric layer and at least covers the second sacrificial layer, wherein the sixth side corresponds to the fourth intermediate layer. In some embodiments, the fourth intermediate layer is made of at least one of the following materials: polymer, insulating dielectric and polysilicon. In some embodiments, the fourth intermediate layer also covers a second terminal of the third electrode layer. In some embodiments, the step of connecting the third layer and the fourth layer comprises: connecting the fourth intermediate layer and the second passive device. In some embodiments, the step of forming at least one second resonance device further comprises: removing the second sacrificial layer to form the second cavity, wherein the first terminal is located in the second cavity.

In some embodiments, the step of forming the fourth layer further comprises: forming a fifth intermediate layer which is located on the eighth side. In some embodiments, the fifth intermediate layer is made of at least one of the following materials: polymer, insulating dielectric and polysilicon. In some embodiments, the step of connecting the third layer and the fourth layer comprises: bonding the fourth intermediate layer and the fifth intermediate layer to form a sixth intermediate layer.

From the above description, the invention has the following beneficial effects: at least one resonance device and a passive device are integrated in one die, so that the passband width is optimized, the out-of-band rejection is high, and less space in an RF front-end chip is occupied. In addition, compared with electrical connection of one resonance device and one passive device, the filter device formed by integrating the resonance device and the passive device in one die can reduce electrical transmission losses, so that the filter performance of the filter device is improved.

BRIEF DESCRIPTION OF THE SEVERAL VIEWS OF THE DRAWINGS

FIG. 1 is a flow diagram of a formation method 100 of a filter device in an embodiment of the invention;

FIG. 2 is a flow diagram of a formation method 200 of a filter device in an embodiment of the invention;

FIG. 11-FIG. 14a are structural diagrams of cross-section A for a formation method of a filter device in an embodiment of the invention;

FIG. 15-FIG. 18a are structural diagrams of cross-section A for a formation method of a filter device in an embodiment of the invention;

FIG. 19-FIG. 22a are structural diagrams of cross-section A for a formation method of a filter device in an embodiment of the invention;

FIG. 23-FIG. 26a are structural diagrams of cross-section A for a formation method of a filter device in an embodiment of the invention;

FIG. 27-FIG. 30a are structural diagrams of cross-section A for a formation method of a filter device in an embodiment of the invention;

Figure 3:
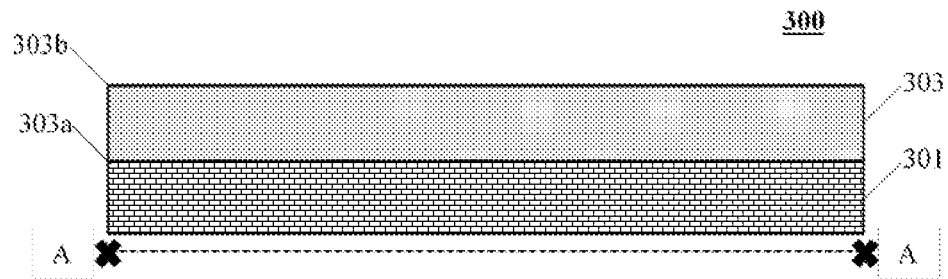
FIG. 3-FIG. 6 are structural diagrams of cross-section A for a formation method of a filter device in an embodiment of the invention.

It should be noted that cross-section A and cross-section B are two orthogonal cross-sections.

DETAILED DESCRIPTION OF THE INVENTION

To gain a better understanding of the purposes, features and advantages of the invention, the specific implementations of the invention are expounded below in conjunction with the accompanying drawings.

Many specific details are given in the following description to obtain a comprehensive appreciation of the invention. Clearly, the invention can also be implemented through other embodiments different from those described hereinafter. Hence, the invention is not limited to the specific embodiments disclosed below.

As described in the description of related art, electrical connection of one resonance device and one passive device (for example, an ASW resonance device or a BAW resonance device is located in a die, and an IPD is located in another die) will occupy more space in the RF front-end chip and will increase the manufacturing cost.

The inventor of the invention finds that a resonance device (such as an SAW resonance device or a BAW resonance device) and a passive device (such as an IPD) can be integrated in one die to form an RF filter device, which can optimize the pass-band width, has a high out-of-band rejection, and occupies less space in the RF front-end chip.

The inventor of the invention also finds that compared with electrical connection of one resonance device and one passive device, the integration of the resonance device and the passive device in one die can reduce electrical transmission losses, thus improving the filter performance.

FIG. 1 is a flow diagram of a formation method 100 of a filter device in an embodiment of the invention.

As shown in FIG. 1, an embodiment of the invention provides a formation method 100 of a filter device, which comprises:

Step S101: a first layer is formed through the following steps:
(1) A first substrate is provided;
(2) A resonance device preprocessing layer for forming at least one first resonance device (such as an SAW resonance device or a BAW resonance device) is formed, wherein the resonance device preprocessing layer has a first side and a second side opposite to the first side, and the first substrate is located on the first side;

Step S103: a second layer is formed through the following steps:
(1) A second substrate is provided;
(2) A first passive device (such as an IPD) is formed, wherein the first passive device has a third side and a fourth side opposite to the third side, and the second substrate is located on the third side;

Step S105: the first layer and the second layer are connected, wherein the first layer is located on the fourth side, and the second layer is located on the second side;

Step S107: the first substrate is removed; and

Step S109: the at least one first resonance device is formed based on the resonance device preprocessing layer.

In this embodiment, the second substrate, the first passive device and the at least one first resonance device are located in a die. In this embodiment, the at least one first resonance device is electrically connected to the first passive device.

In this embodiment, the first substrate is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the second substrate is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the first passive device is formed in Step S103 through the following step: at least one of a capacitor, an inductor, a resistor and a through hole is formed. It should be noted that any passive devices (such as IPDs) known by those skilled in the art can be applied to the embodiments of the invention.

In this embodiment, Step S105 comprises: the resonance device preprocessing layer and the first passive device are connected. It should be noted that any connecting processes (such as the bonding process) known by those skilled in the art can be applied to the embodiments of the invention.

In this embodiment, Step S107 comprises, but is not limited to, at least one of polishing the first substrate and stripping the first substrate.

It should be noted that details of Step S109 will be given in the following embodiments.

It should be noted that an RF filter device formed by integrating a resonance device (such as an SAW resonance device or a BAW resonance device) and a passive device (such as an IPD) in one die can optimize the pass-band width, has a high out-of-band rejection, and occupies less space in an RF front-end chip. In addition, compared with electrical connection of one resonance device and one passive device, the integration of the resonance device and the passive device in one die can reduce electrical transmission losses, thus improving the filter performance.

In an embodiment of the invention, the formation method 100 of the filter device comprises:

Step S101: a first layer is formed through the following steps:
(1) A first substrate is provided;
(2) A resonance device preprocessing layer for forming at least one first resonance device (such as an SAW resonance device or a BAW resonance device) is formed, wherein the resonance device preprocessing layer has a first side and a second side opposite to the first side, and the first substrate is located on the first side;

Step S103: a second layer is formed through the following steps:
(1) A second substrate is provided;
(2) A first passive device (such as an IPD) is formed, wherein the first passive device has a third side and a fourth side opposite to the third side, and the second substrate is located on the third side;

Step S105: the first layer and the second layer are connected, wherein the first layer is located on the fourth side, and the second layer is located on the second side;

Step S107: the first substrate is removed; and

Step S109: the at least one first resonance device is formed based on the resonance device preprocessing layer.

In this embodiment, in Step S101, (2) the resonance device preprocessing layer is formed through the following steps:
(a) An active preprocessing layer located on the first substrate and used for forming an active layer of the at least one first resonance device is formed; and
(b) A reflection preprocessing layer located on the active preprocessing layer and used for forming a reflection layer of the at least one first resonance device is formed, wherein the reflection layer reflects acoustic waves generated by the active layer, the first side corresponds to the active preprocessing layer, and the second side corresponds to the reflection preprocessing layer.

In this embodiment, Step S105 comprises: the reflection preprocessing layer and the first passive device are connected. It should be noted that any connecting processes (such as the bonding process) known by those skilled in the art can be applied to the embodiments of the invention.

In this embodiment, Step S109 comprises:
(1) The active layer is formed based on the active preprocessing layer; and
(2) The reflection layer is formed based on the reflection preprocessing layer.

It should be noted that the resonance device comprises, but is not limited to, the active layer and the reflection layer, wherein the active layer comprises, but is not limited to, a piezoelectric layer and at least one electrode layer, and the reflection layer comprises, but is not limited to, at least one of a cavity and a Bragg reflector.

In an embodiment of the invention, the formation method 100 of the filter device comprises:

Step S101: a first layer is formed through the following steps:
(1) A first substrate is provided;
(2) A resonance device preprocessing layer for forming at least one first resonance device (such as an SAW resonance device or a BAW resonance device) is formed, wherein the resonance device preprocessing layer has a first side and a second side opposite to the first side, and the first substrate is located on the first side;

Step S103: a second layer is formed through the following steps:
(1) A second substrate is provided;
(2) A first passive device (such as an IPD) is formed, wherein the first passive device has a third side and a fourth side opposite to the third side, and the second substrate is located on the third side;

Step S105: the first layer and the second layer are connected, wherein the first layer is located on the fourth side, and the second layer is located on the second side;

Step S107: the first substrate is removed; and

Step S109: the at least one first resonance device is formed based on the resonance device preprocessing layer.

In this embodiment, in Step S101, (2) the resonance device preprocessing layer is formed through the following steps:
(a) An active preprocessing layer located on the first substrate and used for forming an active layer of the at least one first resonance device is formed; and
(b) A reflection preprocessing layer located on the active preprocessing layer and used for forming a reflection layer of the at least one first resonance device is formed, wherein the reflection layer reflects acoustic waves generated by the active layer, the first side corresponds to the active preprocessing layer, and the second side corresponds to the reflection preprocessing layer.

In this embodiment, in Step S101, (2a) the active preprocessing layer is formed through the following steps:
(i) A first piezoelectric layer located on the first substrate is formed; and
(ii) A first electrode layer located on the first piezoelectric layer is formed, wherein the first side corresponds to the first piezoelectric layer.

In this embodiment, Step S105 comprises: the reflection preprocessing layer and the first passive device are connected. It should be noted that any connecting processes (such as the bonding process) known by those skilled in the art can be applied to the embodiments of the invention.

In this embodiment, Step S109 comprises:
(1) A second electrode layer which is located on the first side and contacts with the first piezoelectric layer is formed, wherein the first electrode layer and the second electrode layer are respectively located on two sides of the first piezoelectric layer to form the active layer; and
(2) the reflection layer is formed based on the reflection preprocessing layer.

In an embodiment of the invention, the formation method 100 of the filter device comprises:

Step S101: a first layer is formed through the following steps:
(1) A first substrate is provided;
(2) A resonance device preprocessing layer for forming at least one first resonance device (such as an SAW resonance device or a BAW resonance device) is formed, wherein the resonance device preprocessing layer has a first side and a second side opposite to the first side, and the first substrate is located on the first side;

Step S103: a second layer is formed through the following steps:
(1) A second substrate is provided;
(2) A first passive device (such as an IPD) is formed, wherein the first passive device has a third side and a fourth side opposite to the third side, and the second substrate is located on the third side;

Step S105: the first layer and the second layer are connected, wherein the first layer is located on the fourth side, and the second layer is located on the second side;

Step S107: the first substrate is removed; and

Step S109: the at least one first resonance device is formed based on the resonance device preprocessing layer.

In this embodiment, in Step S101, (2) the resonance device preprocessing layer is formed through the following steps:
(a) An active preprocessing layer located on the first substrate and used for forming an active layer of the at least one first resonance device is formed; and
(b) A reflection preprocessing layer located on the active preprocessing layer and used for forming a reflection layer of the at least one first resonance device is formed, wherein the reflection layer reflects acoustic waves generated by the active layer, the first side corresponds to the active preprocessing layer, and the second side corresponds to the reflection preprocessing layer.

In this embodiment, in Step S101, (2b) the reflection preprocessing layer is formed through the following steps:
(i) A first sacrificial layer located on the active preprocessing layer is formed; and
(ii) A first intermediate layer which is located on the active preprocessing layer and at least covers the first sacrificial layer is formed, wherein the second side corresponds to the first intermediate layer.

In this embodiment, the first intermediate layer is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, Step S105 comprises: the first intermediate layer and the first passive device are connected. It should be noted that any connecting processes (such as the bonding process) known by those skilled in the art can be applied to the embodiments of the invention.

In this embodiment, Step S109 comprises:
(1) The active layer is formed based on the active preprocessing layer; and
(2) The first sacrificial layer is removed to form a first cavity used for reflecting acoustic waves generated by the active layer.

In an embodiment of the invention, the formation method 100 of the filter device comprises:

Step S101: a first layer is formed through the following steps:
(1) A first substrate is provided;
(2) A resonance device preprocessing layer for forming at least one first resonance device (such as an SAW resonance device or a BAW resonance device) is formed, wherein the resonance device preprocessing layer has a first side and a second side opposite to the first side, and the first substrate is located on the first side;

Step S103: a second layer is formed through the following steps:
(1) A second substrate is provided;
(2) A first passive device (such as an IPD) is formed, wherein the first passive device has a third side and a fourth side opposite to the third side, and the second substrate is located on the third side;

Step S105: the first layer and the second layer are connected, wherein the first layer is located on the fourth side, and the second layer is located on the second side;

Step S107: the first substrate is removed; and

Step S109: the at least one first resonance device is formed based on the resonance device preprocessing layer.

In this embodiment, in Step S101, (2) the resonance device preprocessing layer is formed through the following steps:
(a) An active preprocessing layer located on the first substrate and used for forming an active layer of the at least one first resonance device is formed; and
(b) A reflection preprocessing layer located on the active preprocessing layer and used for forming a reflection layer of the at least one first resonance device is formed, wherein the reflection layer reflects acoustic waves generated by the active layer, the first side corresponds to the active preprocessing layer, and the second side corresponds to the reflection preprocessing layer.

In this embodiment, in Step S101, (2b) the reflection preprocessing layer is formed through the following steps:
(i) A first sacrificial layer located on the active preprocessing layer is formed; and
(ii) A first intermediate layer which is located on the active preprocessing layer and at least covers the first sacrificial layer is formed, wherein the second side corresponds to the first intermediate layer.

In this embodiment, the first intermediate layer is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, Step S103 further comprises: (3) a second intermediate layer located on the fourth side is formed, wherein the second substrate and the second intermediate layer are respectively located on two sides of the first passive device.

In this embodiment, the second intermediate layer is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, Step S105 comprises: the first intermediate layer and the second intermediate layer are bonded to form a third intermediate layer. It should be noted that any bonding processes known by those skilled in the art can be applied to the embodiments of the invention.

In this embodiment, Step S109 comprises:
(1) The active layer is formed based on the active preprocessing layer; and
(2) The first sacrificial layer is removed to form a first cavity used for reflecting acoustic waves generated by the active layer.

It should be noted that an RF filter device formed by integrating a resonance device (such as an SAW resonance device or a BAW resonance device) and a passive device (such as the IPD) in one die can optimize the pass-band width, has a high out-of-band rejection, and occupies less space in an RF front-end chip.

FIG. 2 is a flow diagram of a formation method 200 of a filter device in an embodiment of the invention.

As shown in FIG. 2, an embodiment of the invention provides a formation method 200 of a filter device, which comprises:

Step S201: a third layer is formed through the following steps:
(1) A third substrate is provided;
(2) A second piezoelectric layer located on the third substrate is formed;
(3) A third electrode layer located on the second piezoelectric layer is formed;
(4) A cavity preprocessing layer which is located on the second piezoelectric layer and used for forming a second cavity and at least covers a first terminal of the third electrode layer is formed, wherein a fifth side of the third layer corresponds to the third substrate, and a sixth side of the third layer corresponds to the cavity preprocessing layer;

Step S203: a fourth layer is formed through the following steps:
(1) A fourth substrate is provided;
(2) A second passive device is formed, wherein the second passive device has a seventh side and an eighth side opposite to the seventh side, and the fourth substrate is located on the seventh side;

Step S205: the third layer and the fourth layer are connected, wherein the third layer is located on the eighth side, and the fourth layer is located on the sixth side;

Step S207: the third substrate is removed, wherein the fifth side corresponds to the second piezoelectric layer; and Step S209: at least one second resonance device is formed through the following steps:
(1) A fourth electrode layer which is located on the fifth side and contacts with the second piezoelectric layer is formed, wherein the third electrode layer and the fourth electrode layer are respectively located on two sides of the second piezoelectric layer;

(2) The second cavity is formed based on the cavity preprocessing layer.

It should be noted that the active layer comprises the second piezoelectric layer, the third electrode layer and the fourth electrode layer, and the second cavity is used for reflecting acoustic waves generated by the active layer.

In this embodiment, the fourth substrate, the second passive device and the at least one second resonance device are located in a die. In this embodiment, the at least one second resonance device is electrically connected to the second passive device.

In this embodiment, the third substrate is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the fourth substrate is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the second passive device is formed in Step S203 through the following step: at least one of a capacitor, an inductor, a resistor and a through hole is formed. It should be noted that any passive devices (such as IPDs) known by those skilled in the art can be applied to the embodiments of the invention.

In this embodiment, Step S205 comprises: the cavity preprocessing layer and the second passive device are connected. It should be noted that any connecting processes (such as the bonding process) known by those skilled in the art can be applied to the embodiments of the invention.

In this embodiment, Step S207 comprises, but is not limited to, at least one of polishing the third substrate and stripping the third substrate.

It should be noted that an RF filter device formed by integrating a resonance device (such as an SAW resonance device or a BAW resonance device) and a passive device (such as an IPD) in one die can optimize the pass-band width, has a high out-of-band rejection, and occupies less space in an RF front-end chip. In addition, compared with electrical connection of one resonance device and one passive device, the integration of the resonance device and the passive device in one die can reduce electrical transmission losses, thus improving the filter performance In an embodiment of the invention, the formation method 200 of the filter device comprises:

Step S201: a third layer is formed through the following steps:
 (1) A third substrate is provided;
 (2) A second piezoelectric layer located on the third substrate is formed;
 (3) A third electrode layer located on the second piezoelectric layer is formed;
 (4) A cavity preprocessing layer which is located on the second piezoelectric layer and used for forming a second cavity and at least covers a first terminal of the third electrode layer is formed, wherein a fifth side of the third layer corresponds to the third substrate, and a sixth side of the third layer corresponds to the cavity preprocessing layer;

Step S203: a fourth layer is formed through the following steps:
 (1) A fourth substrate is provided;
 (2) A second passive device is formed, wherein the second passive device has a seventh side and an eighth side opposite to the seventh side, and the fourth substrate is located on the seventh side;

Step S205: the third layer and the fourth layer are connected, wherein the third layer is located on the eighth side, and the fourth layer is located on the sixth side;

Step S207: the third substrate is removed, wherein the fifth side corresponds to the second piezoelectric layer; and Step S209: at least one second resonance device is formed through the following steps:
 (1) A fourth electrode layer which is located on the fifth side and contacts with the second piezoelectric layer is formed, wherein the third electrode layer and the fourth electrode layer are respectively located on two sides of the second piezoelectric layer; and
 (2) The second cavity is formed based on the cavity preprocessing layer.

It should be noted that the active layer comprises the second piezoelectric layer, the third electrode layer and the fourth electrode layer, and the second cavity is used for reflecting acoustic waves generated by the active layer.

In this embodiment, in Step S201, (4) the cavity preprocessing layer is formed through the following steps:
 (a) A second sacrificial layer which is located on the second piezoelectric layer and at least covers the first terminal is formed; and
 (b) A fourth intermediate layer which is located on the second piezoelectric layer and at least covers the second sacrificial layer is formed, wherein the sixth side corresponds to the fourth intermediate layer.

In this embodiment, the fourth intermediate layer is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide. In this embodiment, the fourth intermediate layer also covers a second terminal of the third electrode layer.

In this embodiment, Step S205 comprises: the fourth intermediate layer and the second passive device are connected. It should be noted that any connecting processes (such as the bonding process) known by those skilled in the art can be applied to the embodiments of the invention.

In this embodiment, in Step S209, (2) the second cavity is formed based on the cavity preprocessing layer through the following step: the second sacrificial layer is removed to form the second cavity, wherein the first terminal is located in the second cavity.

In an embodiment of the invention, the formation method 200 of the filter device comprises:

Step S201: a third layer is formed through the following steps:
 (1) A third substrate is provided;
 (2) A second piezoelectric layer located on the third substrate is formed;
 (3) A third electrode layer located on the second piezoelectric layer is formed;

(4) A cavity preprocessing layer which is located on the second piezoelectric layer and used for forming a second cavity and at least covers a first terminal of the third electrode layer is formed, wherein a fifth side of the third layer corresponds to the third substrate, and a sixth side of the third layer corresponds to the cavity preprocessing layer;

Step S203: a fourth layer is formed through the following steps:
(1) A fourth substrate is provided;
(2) A second passive device is formed, wherein the second passive device has a seventh side and an eighth side opposite to the seventh side, and the fourth substrate is located on the seventh side;

Step S205: the third layer and the fourth layer are connected, wherein the third layer is located on the eighth side, and the fourth layer is located on the sixth side;

Step S207: the third substrate is removed, wherein the fifth side corresponds to the second piezoelectric layer; and Step S209: at least one second resonance device is formed through the following steps:
(1) A fourth electrode layer which is located on the fifth side and contacts with the second piezoelectric layer is formed, wherein the third electrode layer and the fourth electrode layer are respectively located on two sides of the second piezoelectric layer; and
(2) The second cavity is formed based on the cavity preprocessing layer.

It should be noted that the active layer comprises the second piezoelectric layer, the third electrode layer and the fourth electrode layer, and the second cavity is used for reflecting acoustic waves generated by the active layer.

In this embodiment, in Step S201, (4) the cavity preprocessing layer is formed through the following steps:
(a) A second sacrificial layer which is located on the second piezoelectric layer and at least covers the first terminal is formed; and
(b) A fourth intermediate layer which is located on the second piezoelectric layer and at least covers the second sacrificial layer is formed, wherein the sixth side corresponds to the fourth intermediate layer.

In this embodiment, the fourth intermediate layer is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide. In this embodiment, the fourth intermediate layer also covers a second terminal of the third electrode layer.

In this embodiment, Step S203 further comprises: (3) a fifth intermediate layer located on the eighth side is formed.

In this embodiment, the fifth intermediate layer is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide. In this embodiment, the fourth intermediate layer also covers a second terminal of the third electrode layer.

In this embodiment, Step S205 comprises: the fourth intermediate layer and the fifth intermediate layer are bonded to form a sixth intermediate layer. It should be noted that any bonding processes known by those skilled in the art can be applied to the embodiments of the invention.

In this embodiment, in Step S209, (2) the second cavity is formed based on the cavity preprocessing layer through the following step: the second sacrificial layer is removed to form the second cavity, wherein the first terminal is located in the second cavity.

It should be noted that an RF filter device formed by integrating a resonance device (such as an SAW resonance device or a BAW resonance device) and a passive device (such as an IPD) in one die can optimize the pass-band width, has a high out-of-band rejection, and occupies less space in an RF front-end chip.

To gain a better understanding of the invention, the following specific embodiments of the formation method the filter device of the invention are provided in conjunction with the cross-sectional structural diagrams of the filter device. Clearly, the invention can also be implemented by other embodiments different from the following ones. Hence, the invention is not limited to the specific embodiments disclosed below.

FIG. 3-FIG. 6 are structural diagrams of cross-section A for a formation method of a filter device in an embodiment of the invention.

As shown in FIG. 3, the formation method of the filter device comprises: a fifth layer is formed through the following steps: a substrate 301 is provided; and A resonance device preprocessing layer 303 for forming at least one resonance device is formed, wherein the resonance device preprocessing layer 303 has a first side 303a and a second side 303b, and the substrate 301 is located on the first side 303a.

In this embodiment, the substrate 301 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

Figure 4:
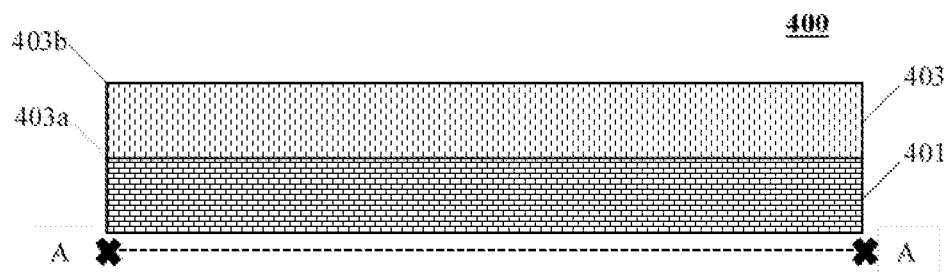

As shown in FIG. 4, the formation method of the filter device further comprises: a sixth layer is formed through the following steps:
A substrate 401 is provided; and
A passive device 403 is formed, wherein the passive device 403 has a third side 403a and a fourth side 403b, and the substrate 401 is located on the third side 403a.

In this embodiment, the substrate 401 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 403 comprises, but is not limited to, at least one of a capacitor, an inductor, a resistor and a through hole. It should be noted that any passive devices (such as IPDs) known by those skilled in the art can be applied to the embodiments of the invention.

Figure 5:
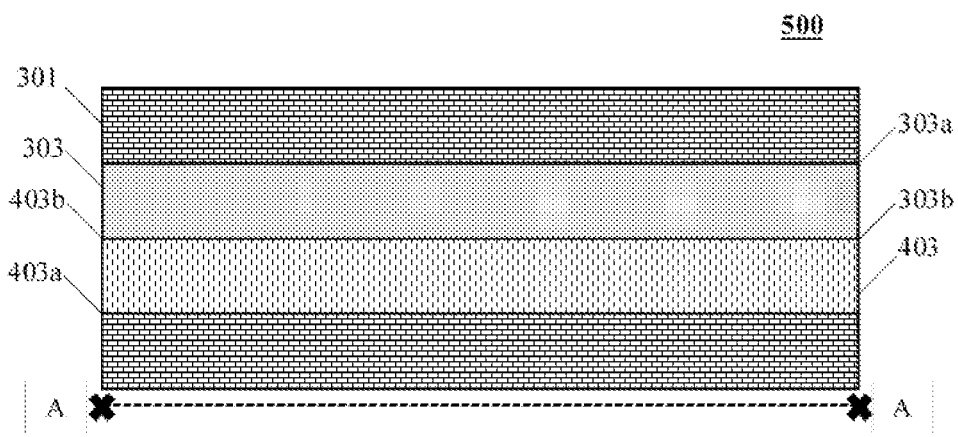

As shown in FIG. 5, the formation method of the filter device further comprises: the fifth layer and the sixth layer are connected.

In this embodiment, the fifth layer and the sixth layer are connected through the following step: the resonance device preprocessing layer 303 and the passive device 403 are connected, wherein the resonance device preprocessing layer 303 is located on the fourth side 403b, and the passive device 403 is located on the second side 303b.

It should be noted that any connecting processes (such as the bonding process) known by those skilled in the art can be applied to the embodiments of the invention.

Figure 6:
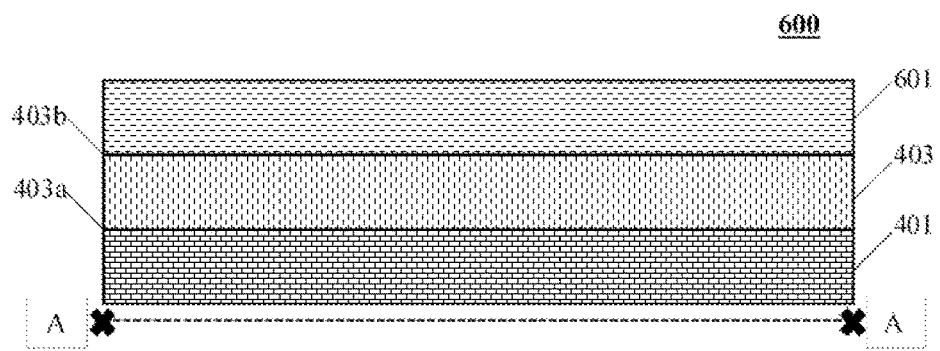

As shown in FIG. 6, the formation method of the filter device further comprises:

The substrate 301 is removed; and

At least one resonance device 601 located on the fourth side 403b is formed based on the resonance device preprocessing layer 303.

It should be noted that the substrate 401, the passive device 403 and the at least one resonance device 601 are located in a die.

In this embodiment, the at least one resonance device 601 includes, but is not limited to, at least one of an SAW resonance device and a BAW resonance device. In this embodiment, the at least one resonance device 601 is electrically connected to the passive device 403.

It should be noted that an RF filter device formed by integrating a resonance device (such as an SAW resonance device or a BAW resonance device) and a passive device (such as an IPD) in one die can optimize the pass-band width, has a high out-of-band rejection, and occupies less space in an RF front-end chip.

FIG. 7-FIG. 10 are structural diagrams of cross-section A for a formation method of a filter device in an embodiment of the invention.

Figure 7:
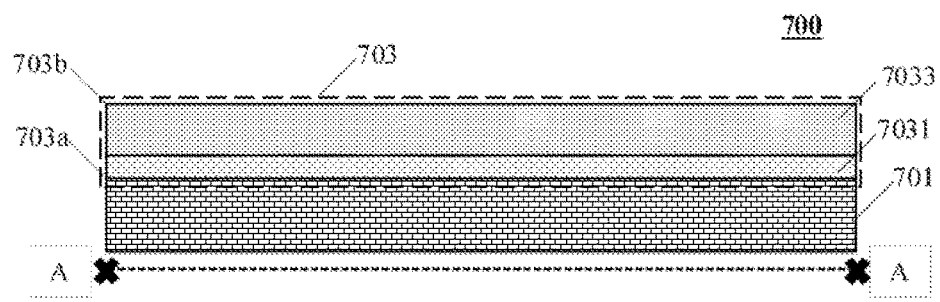
FIG. 7-FIG. 10 are structural diagrams of cross-section A for a formation method of a filter device in an embodiment of the invention.

As shown in FIG. 7, the formation method of the filter device comprises: a fifth layer is formed through the following steps: a substrate 701 is provided; and A resonance device preprocessing layer 703 for forming at least one resonance device is formed, wherein the resonance device preprocessing layer 703 has a first side 703a and a second side 703b, and the substrate 701 is located on the first side 703a.

In this embodiment, the substrate 701 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the resonance device preprocessing layer 703 is formed through the following steps:

An active preprocessing layer 7031 located on the substrate 701 and used for forming an active layer of the at least one resonance device is formed; and A reflection preprocessing layer 7033 located on the active preprocessing layer 7031 and used for forming a reflection layer of the at least one resonance device to reflect acoustic waves generated by the active layer is formed, wherein the first side 703a corresponds to the active preprocessing layer 7031, and the second side 703b corresponds to the reflection preprocessing layer 7033; and the substrate 701 and the reflection preprocessing layer 7033 are respectively located on two sides of the active preprocessing layer 7031.

Figure 8:
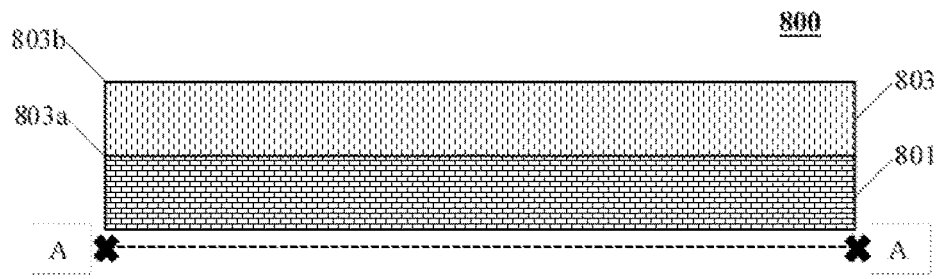

As shown in FIG. 8, the formation method of the filter device further comprises: a sixth layer is formed through the following steps:

A substrate 801 is provided; and

A passive device 803 is formed, wherein the passive device 803 has a third side 803a and a fourth side 803b, and the substrate 801 is located on the third side 803a.

In this embodiment, the substrate 801 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 803 comprises, but is not limited to, at least one of a capacitor, an inductor, a resistor and a through hole. It should be noted that any passive devices (such as IPDs) known by those skilled in the art can be applied to the embodiments of the invention.

Figure 9:
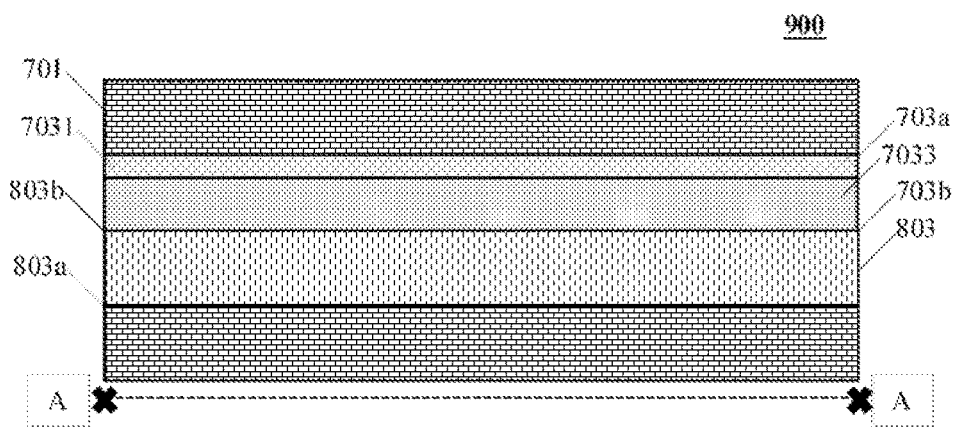

As shown in FIG. 9, the formation method of the filter device further comprises: the fifth layer and the sixth layer are connected.

In this embodiment, the fifth layer and the sixth layer are connected through the following step: the reflection preprocessing layer 7033 and the passive device 803 are connected, wherein the reflection preprocessing layer 7033 is located on the fourth side 803b, and the passive device 803 is located on the second side 703b.

It should be noted that any connecting processes (such as the bonding process) known by those skilled in the art can be applied to the embodiments of the invention.

Figure 10:
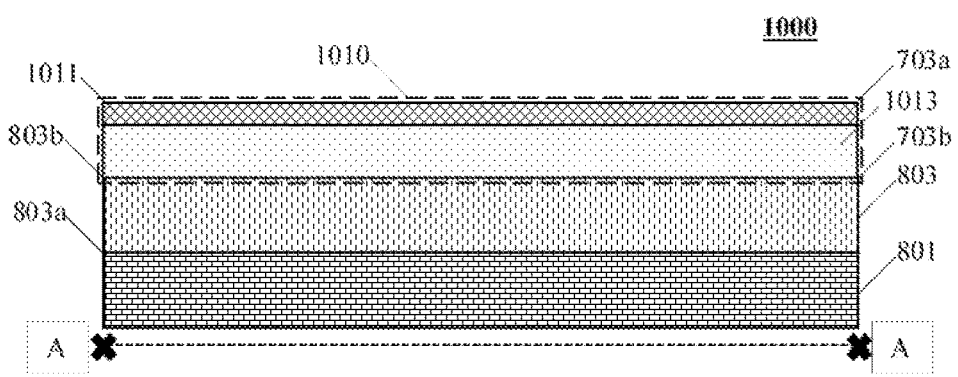

As shown in FIG. 10, the formation method of the filter device further comprises:

The substrate 701 is removed; and

At least one resonance device 1010 located on the fourth side 803b is formed based on the resonance device preprocessing layer 703.

It should be noted that the substrate 801, the passive device 803 and the at least one resonance device 1010 are located in a die.

In this embodiment, the at least one resonance device 1010 includes, but is not limited to, at least one of an SAW resonance device and a BAW resonance device. In this embodiment, the at least one resonance device 1010 is electrically connected to the passive device 803.

In this embodiment, the at least one resonance device 1010 is formed through the following steps:

An active layer 1011 of the at least one resonance device 1010 is formed based on the active preprocessing layer 7031; and A reflection layer 1013 of the at least one resonance device 1010 is formed based on the reflection preprocessing layer 7033 to reflect acoustic waves generated by the active layer 1011.

In this embodiment, the active layer 1011 comprises, but is not limited to, a piezoelectric layer (not shown) and at least one electrode layer (not shown).

In this embodiment, the reflection layer 1013 comprises, but is not limited to, at least one of a cavity and a Bragg reflector.

It should be noted that an RF filter device formed by integrating a resonance device (such as an SAW resonance device or a BAW resonance device) and a passive device (such as an IPD) in one die can optimize the pass-band width, has a high out-of-band rejection, and occupies less space in an RF front-end chip.

FIG. 11-FIG. 14a are structural diagrams of cross-section A for a formation method of a filter device in an embodiment of the invention.

Figure 11:
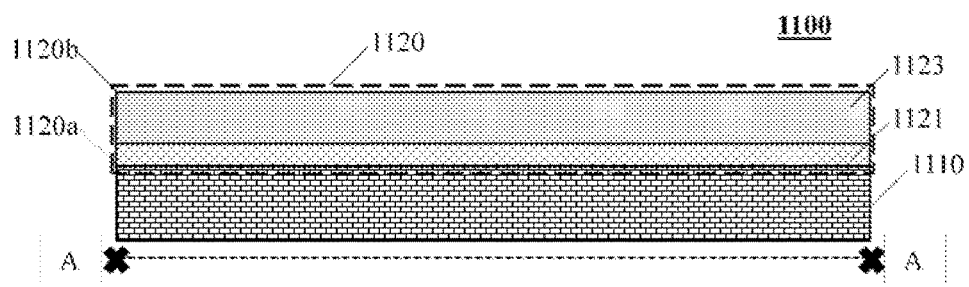

As shown in FIG. 11, the formation method of the filter device comprises: a fifth layer is formed through the following steps:

A substrate 1110 is provided; and

A resonance device preprocessing layer 1120 for forming at least one resonance device is formed, wherein the resonance device preprocessing layer 1120 has a first side 1120a and a second side 1120b, and the substrate 1110 is located on the first side 1120a.

In this embodiment, the substrate 1110 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the resonance device preprocessing layer 1120 is formed through the following steps:

An active preprocessing layer 1121 located on the substrate 1110 and used for forming an active layer of the at least one resonance device is formed; and A reflection preprocessing layer 1123 located on the active preprocessing layer 1121 and used for forming a reflection layer of the at least one resonance device to reflect acoustic waves generated by the active layer is formed, wherein the first side 1120a corresponds to the active preprocessing layer 1121, and the second side 1120b corresponds to the reflection preprocessing layer 1123; and the substrate 1110 and the reflection preprocessing layer 1123 are respectively located on two sides of the active preprocessing layer 1121.

Figure 12:
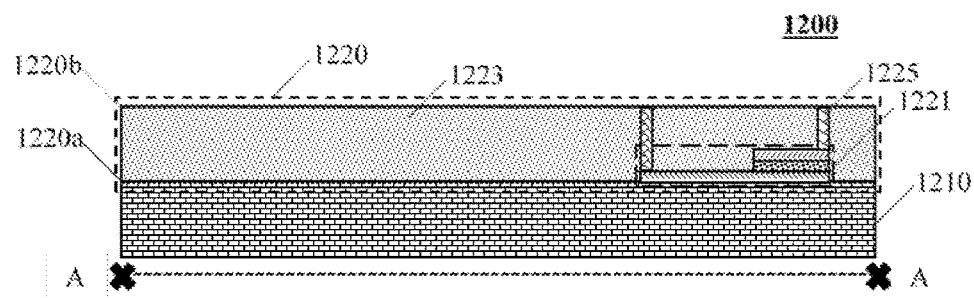

As shown in FIG. 12, the formation method of the filter device further comprises: a sixth layer is formed through the following steps:

A substrate 1210 is provided; and

A passive device 1220 is formed, wherein the passive device 1220 has a third side 1220a and a fourth side 1220b, and the substrate 1210 is located on the third side 1220a.

In this embodiment, the substrate 1210 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 1220 is formed through the following steps:

A metal-insulator-metal (MIM) capacitor 1221 located on the substrate 1210 is formed;

An intermediate layer 1223 which is located on the substrate 1210 and covers the MIM capacitor 1221 is formed; and A through hole 1225 inlaid in the intermediate layer 1223 and connected to the MIM capacitor 1221 is formed.

In this embodiment, the MIM capacitor 1221 is formed through a semiconductor process. It should be noted that the MIM capacitor in this embodiment is merely a specific example which is not intended to limit the invention, and capacitors manufactured through other semiconductor processes known by those skilled in the art, such as metal-oxide-metal (MOM) capacitors, can also be applied to the embodiments of the invention.

In this embodiment, the intermediate layer 1223 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

Figure 13:
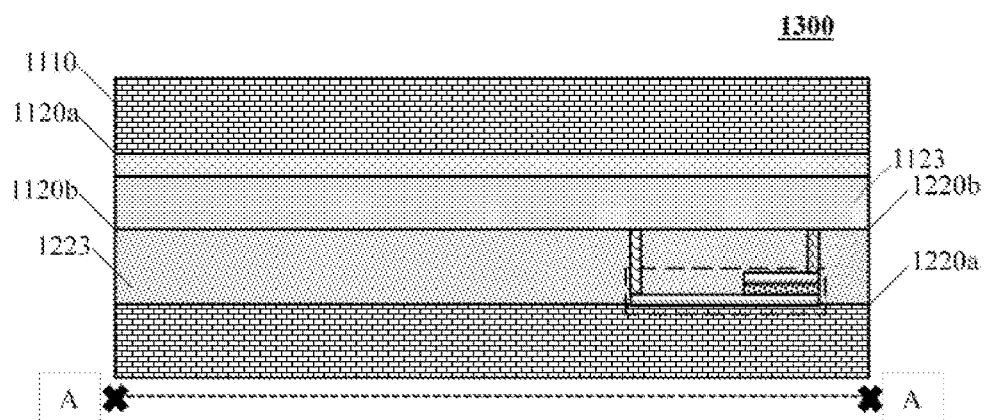

As shown in FIG. 13, the formation method of the filter device further comprises: the fifth layer and the sixth layer are connected.

In this embodiment, the fifth layer and the sixth layer are connected through the following step: the reflection preprocessing layer 1123 and the intermediate layer 1223 are connected, wherein the reflection preprocessing layer 1123 is located on the fourth side 1220b, and the intermediate layer 1223 is located on the second side 1120b.

It should be noted that any connecting processes (such as the bonding process) known by those skilled in the art can be applied to the embodiments of the invention.

Figure 14A:
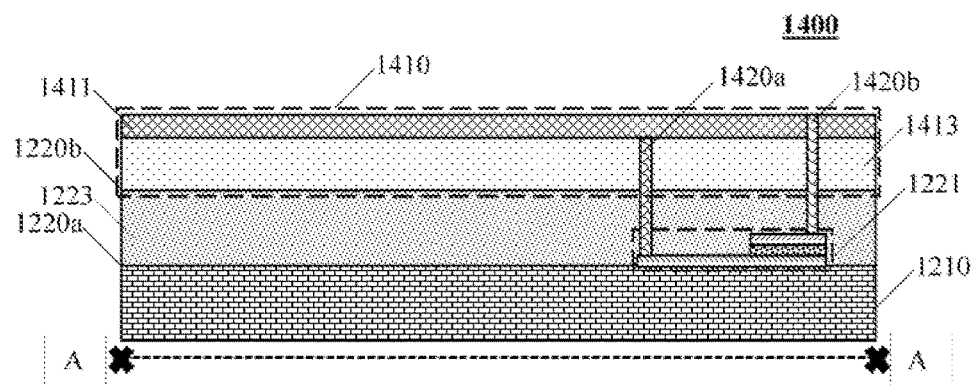

As shown in FIG. 14a, the formation method of the filter device further comprises:

The substrate 1110 is removed; and

At least one resonance device 1410 located on the fourth side 1220b is formed based on the resonance device preprocessing layer 1120.

It should be noted that the substrate 1210, the MIM capacitor 1221 and the at least one resonance device 1410 are located in a die.

In this embodiment, the at least one resonance device 1410 includes, but is not limited to, at least one of an SAW resonance device and a BAW resonance device.

In this embodiment, the at least one resonance device 1410 is formed through the following steps:

An active layer 1411 of the at least one resonance device 1410 is formed based on the active preprocessing layer 1121, and a reflection layer 1413 of the at least one resonance device 1410 is formed based on the reflection preprocessing layer 1123 to reflect acoustic waves generated by the active layer 1411.

In this embodiment, the active layer 1411 comprises, but is not limited to, a piezoelectric layer (not shown) and at least one electrode layer (not shown).

In this embodiment, the reflection layer 1413 comprises, but is not limited to, at least one of a cavity and a Bragg reflector.

In this embodiment, the formation method of the filter device further comprises: a through hole 1420a and a through hole 1420b are formed based on the through hole 1225, wherein the active layer 1411 is electrically connected to a first terminal of the MIM capacitor 1221 via the through hole 1420a, and a second terminal of the MIM capacitor 1221 is grounded via the through hole 1420b.

Figure 14B:
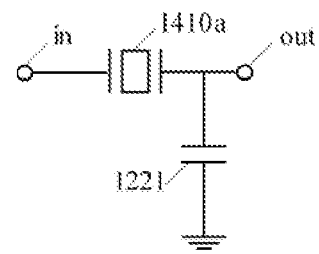
FIG. 14b is an equivalent circuit diagram of a filter device 1400.

As shown in FIG. 14b, an equivalent circuit diagram of the filter device 1400 comprises one resonance device 1410a of the at least one resonance device 1410, and the MIM capacitor 1221, wherein a first terminal of the resonance device 1410a is connected to an input terminal in, a second terminal of the resonance device 1410a is electrically connected to the first terminal of the MIM capacitor 1221 and is also connected to an output terminal out, the first terminal of the MIM capacitor 1221 is also connected to the output terminal out, and the second terminal of the MIM capacitor 1221 is grounded.

It should be noted that an RF filter device formed by integrating a resonance device (such as an SAW resonance device or a BAW resonance device) and a passive device (such as an IPD) in one die can optimize the pass-band width, has a high out-of-band rejection, and occupies less space in an RF front-end chip.

In addition, compared with electrical connection of one resonance device and one passive device, the integration of the resonance device and the passive device in one die can reduce electrical transmission losses, thus improving the filter performance.

FIG. 15-FIG. 18a are structural diagrams of cross-section A for a formation method of a filter device in an embodiment of the invention.

Figure 15:
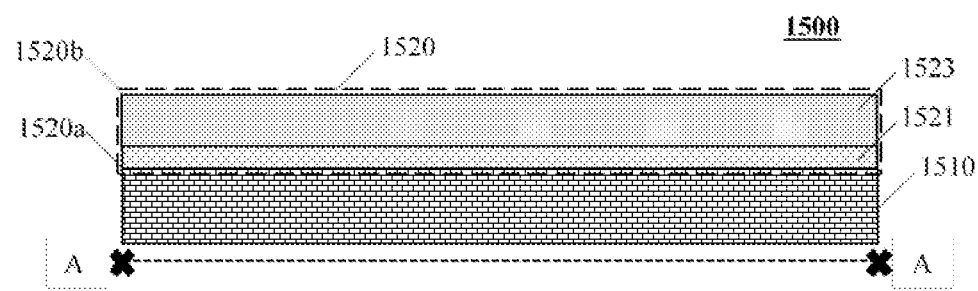

As shown in FIG. 15, the formation method of the filter device comprises: a fifth layer is formed through the following steps:

A substrate 1510 is provided; and

A resonance device preprocessing layer 1520 for forming at least one resonance device is formed, wherein the resonance device preprocessing layer 1520 has a first side 1520a and a second side 1520b, and the substrate 1510 is located on the first side 1520a.

In this embodiment, the substrate 1510 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the resonance device preprocessing layer 1520 is formed through the following steps:

An active preprocessing layer 1521 located on the substrate 1510 and used for forming an active layer of the at least one resonance device is formed; and A reflection preprocessing layer 1523 located on the active preprocessing layer 1521 and used for forming a reflection layer of the at least one resonance device to reflect acoustic waves generated by the active layer is formed, wherein the first side 1520a corresponds to the active preprocessing layer 1521, the second side 1520b corresponds to the reflection preprocessing layer 1523, and the substrate 1510 and the reflection preprocessing layer 1523 are respectively located on two sides of the active preprocessing layer 1521.

Figure 16:
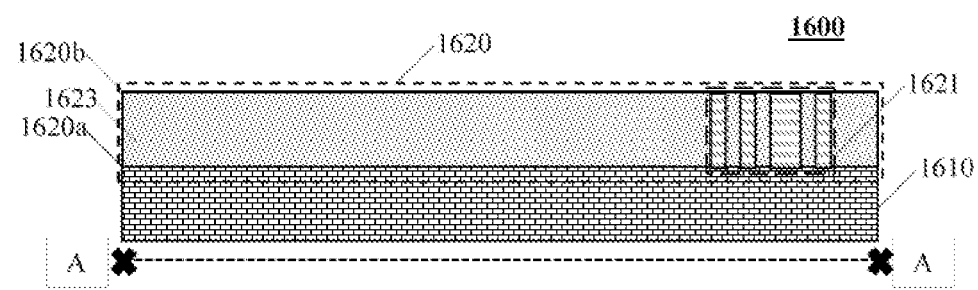

As shown in FIG. 16, the formation method of the filter device further comprises: a sixth layer is formed through the following steps:

A substrate 1610 is provided; and

A passive device 1620 is formed, wherein the passive device 1620 has a third side 1620a and a fourth side 1620b, and the substrate 1610 is located on the third side 1620a.

In this embodiment, the substrate 1610 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 1620 is formed through the following steps:

A spiral inductor 1621 located on the substrate 1610 is formed; and

An intermediate layer 1623 located on the substrate 1610 and inlaid in the intermediate layer 1623 is formed.

In this embodiment, the thickness of the spiral inductor 1621 is equal to that of the intermediate layer 1623. In another embodiment, the thickness of the spiral inductor is different from that of the intermediate layer.

In this embodiment, the spiral inductor 1621 is formed through a semiconductor process. It should be noted that the spiral inductor in this embodiment is merely a specific example which is not intended to limit the invention, and inductors manufactured by other semiconductor processes known by those skilled in the art can also be applied to the embodiments of the invention.

In this embodiment, the intermediate layer 1623 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

Figure 17:
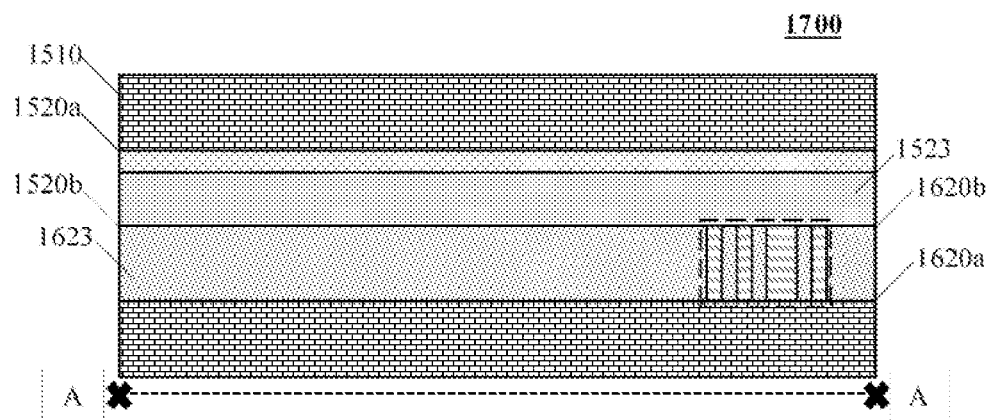

As shown in FIG. 17, the formation method of the filter device comprises: the fifth layer and the sixth layer are connected.

In this embodiment, the fifth layer and the sixth layer are connected through the following step: the reflection preprocessing layer 1523 and the intermediate layer 1623 are connected, wherein the reflection preprocessing layer 1523 is located on the fourth side 1620b, and the intermediate layer 1623 is located on the second side 1520b.

It should be noted that any connecting processes (such as the bonding process) known by those skilled in the art can be applied to the embodiments of the invention.

Figure 18A:
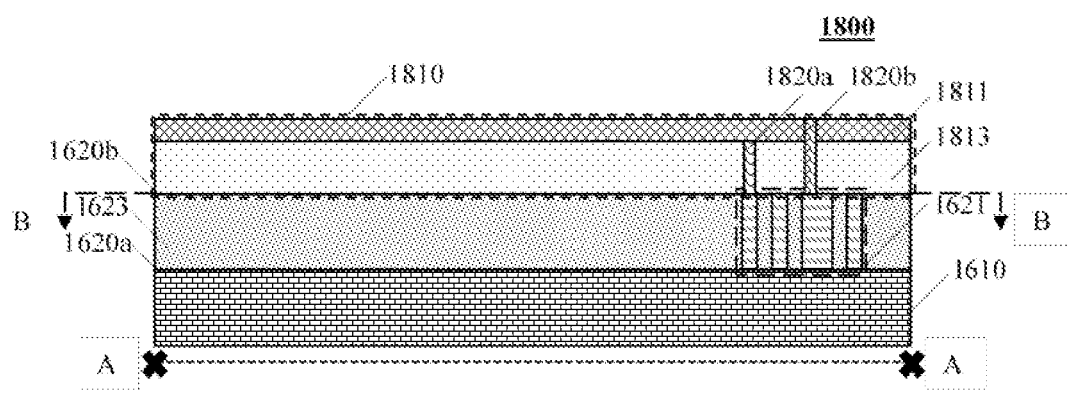

As shown in FIG. 18a, the formation method of the filter device further comprises:

The substrate 1510 is removed; and

At least one resonance device 1810 located on the fourth side 1620b is formed based on the resonance device preprocessing layer 1520.

It should be noted that the substrate 1610, the spiral inductor 1621 and the at least one resonance device 1810 are located in a die.

In this embodiment, the at least one resonance device 1810 includes, but is not limited to, at least one of an SAW resonance device and a BAW resonance device.

In this embodiment, the at least one resonance device 1810 is formed through the following steps:

An active layer 1811 of the at least one resonance device 1810 is formed based on the active preprocessing layer 1521; and A reflection layer 1813 of the at least one resonance device 1810 is formed based on the reflection preprocessing layer 1523 to reflect acoustic waves generated by the active layer 1811.

In this embodiment, the active layer 1811 comprises, but is not limited to, a piezoelectric layer (not shown) and at least one electrode layer (not shown).

In this embodiment, the reflection layer 1813 comprises, but is not limited to, at least one of a cavity and a Bragg reflector.

In this embodiment, the formation method of the filter device further comprises: a through hole 1820a and a through hole 1820b are formed based on the spiral inductor 1621, wherein the active layer 1811 is electrically connected to a first terminal of the spiral inductor 1621 via the through hole 1820a, and a second terminal of the spiral inductor 1621 is grounded via the through hole 1820b.

Figure 18B:
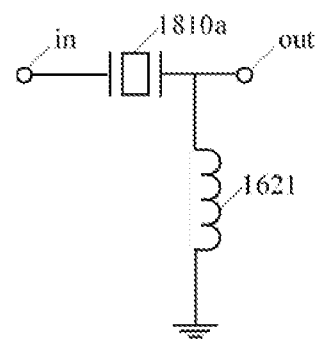
FIG. 18b is an equivalent circuit diagram of a filter device 1800.

As shown in FIG. 18b, an equivalent circuit diagram of the filter device 1800 comprises: one resonance device 1810a of at least one resonance device 1810, and the spiral inductor 1621, wherein a first terminal of the resonance device 1810a is connected to an input terminal in, a second terminal of the resonance device 1810*a* is electrically connected to the first terminal of the spiral inductor 1621 and is also connected to an output terminal out, the first terminal of the spiral inductor 1621 is also connected to the output terminal out, and the second terminal of the spiral inductor 1621 is grounded.

Figure 18C:
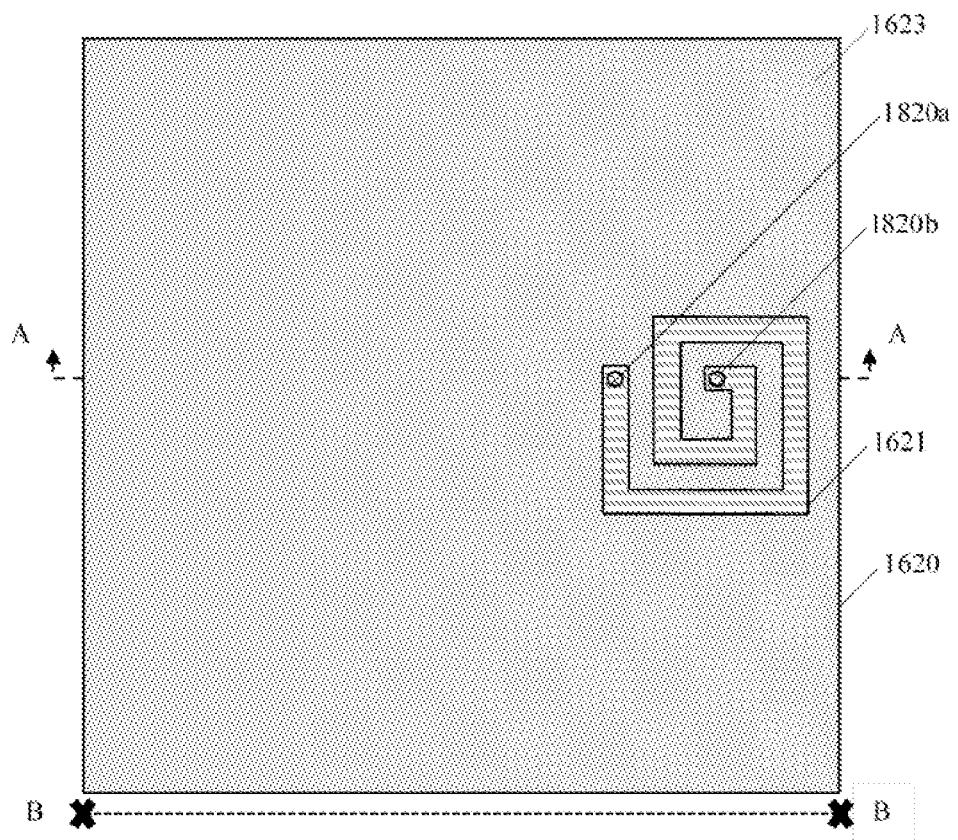
FIG. 18c is a structural diagram of cross-section B of the filter device 1800.

FIG. 18*c* is a structural diagram of cross-section B of the filter device 1800 (namely, a top view of the passive device 1620).

As shown in FIG. 18*c*, in this embodiment, cross-section B of the spiral inductor 1621 is quadrangular. In another embodiment, cross-section B of the spiral inductor is of, but not limited to, at least one of the following shapes: pentagonal shape, hexagonal shape, octagonal shape, circular shape and oval shape. In this embodiment, the spiral inductor 1621 comprises two layers of coils. In another embodiment, the inductor may comprise three or more layers of coils. It should be noted that the spiral inductor in this embodiment is merely a specific example which is not intended to limit the invention, and other spiral inductors known by those skilled in the art can also be applied to the embodiments of the invention.

It should be noted that an RF filter device formed by integrating a resonance device (such as an SAW resonance device or a BAW resonance device) and a passive device (such as an IPD) in one die can optimize the pass-band width, has a high out-of-band rejection, and occupies less space in an RF front-end chip.

In addition, compared with electrical connection of one resonance device and one passive device, the integration of the resonance device and the passive device in one die can reduce electrical transmission losses, thus improving the filter performance.

FIG. 19-FIG. 22*a* is a structural diagram of cross-section A for a formation method of a filter device in an embodiment of the invention.

Figure 19:
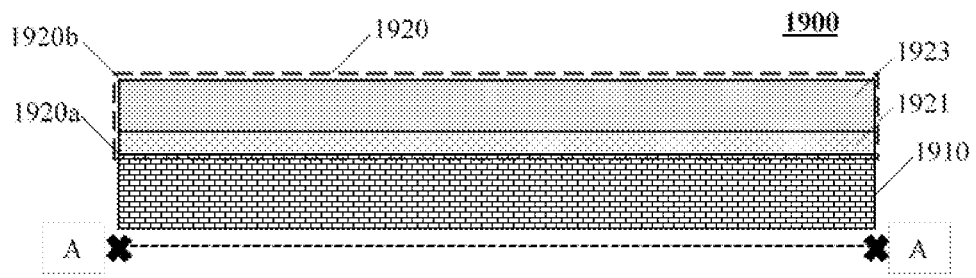

As shown in FIG. 19, the formation method of the filter device comprises: a fifth layer is formed through the following steps:

A substrate 1910 is provided; and

A resonance device preprocessing layer 1920 for forming at least one resonance device is formed, wherein the resonance device preprocessing layer 1920 has a first side 1920*a* and a second side 1920*b*, and the substrate 1910 is located on the first side 1920*a*.

In this embodiment, the substrate 1910 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the resonance device preprocessing layer 1920 is formed through the following steps:

An active preprocessing layer 1921 located on the substrate 1910 and used for forming an active layer of the at least one resonance device is formed; and A reflection preprocessing layer 1923 located on the active preprocessing layer 1921 and used for forming a reflection layer of the at least one resonance device to reflect acoustic waves generated by the active layer is formed wherein the first side 1920*a* corresponds to the active preprocessing layer 1921, the second side 1920*b* corresponds to the reflection preprocessing layer 1923, and the substrate 1910 and the reflection preprocessing layer 1923 are respectively located on two sides of the active preprocessing layer 1921.

Figure 20:
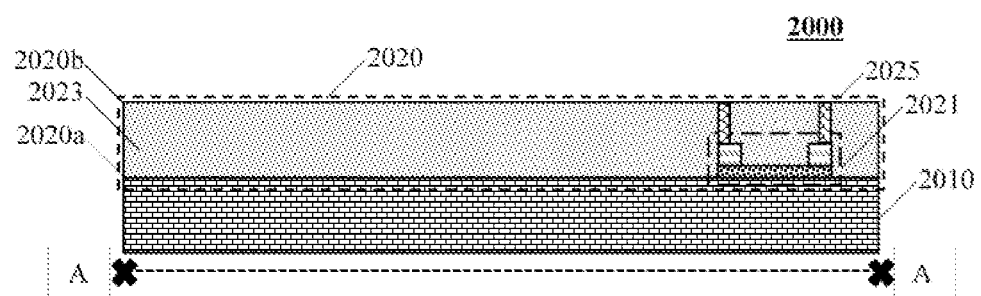

As shown in FIG. 20, the formation method of the filter device further comprises: a sixth layer is formed through the following steps:

A substrate 2010 is provided; and

A passive device 2020 is formed, wherein the passive device 2020 has a third side 2020*a* and a fourth side 2020*b*, and the substrate 2010 is located on the third side 2020*a*.

In this embodiment, the substrate 2010 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 2020 is formed through the following steps:

A resistor 2021 located on the substrate 2010 is formed;

An intermediate layer 2023 which is located on the substrate 2010 and covers the resistor 2021 is formed; and A through hole 2025 inlaid in the intermediate layer 2023 and connected to the resistor 2021 is formed.

In this embodiment, the resistor 2021 is formed through a semiconductor process. It should be noted that the resistor in this embodiment is merely a specific example which is not intended to limit the invention, and resistors manufactured through other semiconductor processes known by those skilled in the art can be applied to the embodiments of the invention.

In this embodiment, the intermediate layer 2023 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

Figure 21:
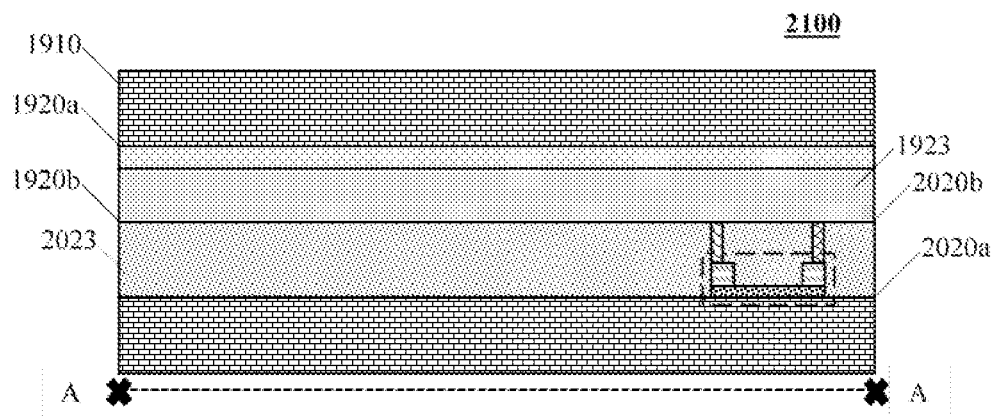

As shown in FIG. 21, the formation method of the filter device further comprises: the fifth layer and the sixth layer are connected.

In this embodiment, the fifth layer and the sixth layer are connected through the following step: the reflection preprocessing layer 1923 and the intermediate layer 2023 are connected, wherein the reflection preprocessing layer 1923 is located on the fourth side 2020*b*, and the intermediate layer 2023 is located on the second side 1920*b*.

It should be noted that any connecting processes (such as the bonding process) known by those skilled in the art can be applied to the embodiments of the invention.

Figure 22A:
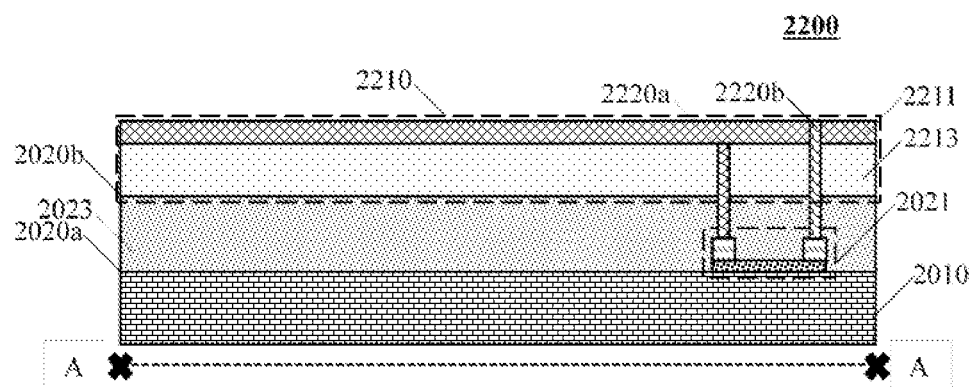

As shown in FIG. 22*a*, the formation method of the filter device further comprises:

The substrate 1910 is removed; and

At least one resonance device 2210 located on the fourth side 2020*b* is formed based on the resonance device preprocessing layer 1920.

It should be noted that the substrate 2010, the resistor 2021 and the at least one resonance device 2210 are located in a die.

In this embodiment, the at least one resonance device 2210 includes, but is not limited to, at least one of an SAW resonance device and a BAW resonance device.

In this embodiment, the at least one resonance device 2210 is formed through the following steps:

An active layer 2211 of the at least one resonance device 2210 is formed based on the active preprocessing layer 1921; and A reflection layer 2213 of the at least one resonance device 2210 is formed based on the reflection preprocessing layer 1923 to reflect acoustic waves generated by the active layer 2211.

In this embodiment, the active layer 2211 comprises, but is not limited to, a piezoelectric layer (not shown) and at least one electrode layer (not shown).

In this embodiment, the reflection layer 2213 comprises, but is not limited to, at least one of a cavity and a Bragg reflector.

In this embodiment, the formation method of the filter device further comprises: a through hole 2220a and a through hole 2220b are formed based on the through hole 2025, wherein the active layer 2211 is electrically connected to a first terminal of the resistor 2021 via the through hole 2220a, and a second terminal of the resistor 2021 is grounded via the through hole 2020b.

Figure 22B:
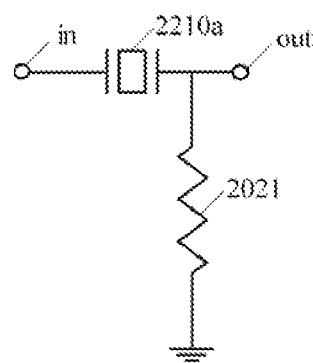
FIG. 22b is an equivalent circuit diagram of a filter device 2200.

As shown in FIG. 22b, an equivalent circuit diagram of the filter device 2200 comprises: one resonance device 2210a of the at least one resonance device 2210, and the resistor 2021, wherein a first terminal of the resonance device 2210a is connected to an input terminal in, a second terminal of the resonance device 2210a is electrically connected to the first terminal of the resistor 2021 and is also connected to an output terminal out, the first terminal of the resistor 2021 is also connected to the output terminal out, and the second terminal of the resistor 2021 is grounded.

It should be noted that an RF filter device formed by integrating a resonance device (such as an SAW resonance device or a BAW resonance device) and a passive device (such as an IPD) in one die can optimize the pass-band width, has a high out-of-band rejection, and occupies less space in an RF front-end chip.

In addition, compared with electrical connection of one resonance device and one passive device, the integration of the resonance device and the passive device in one die can reduce electrical transmission losses, thus improving the filter performance.

FIG. 23-FIG. 26a are structural diagrams of cross-section A for a formation method of a filter device in an embodiment of the invention.

Figure 23:
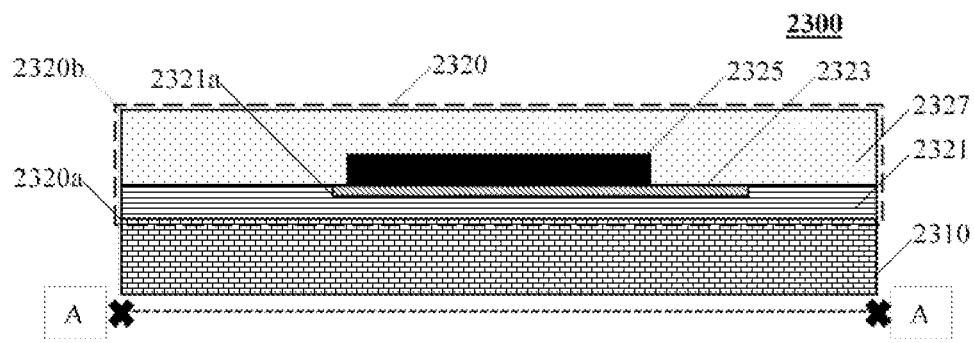

As shown in FIG. 23, the formation method of the filter device comprises: a fifth layer is formed through the following steps:

A substrate 2310 is provided; and

A resonance device preprocessing layer 2320 for forming at least one resonance device is formed, wherein the resonance device preprocessing layer 2320 has a first side 2320a and a second side 2320b, and the substrate 2310 is located on the first side 2320a.

In this embodiment, the substrate 2310 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the resonance device preprocessing layer 2320 is formed through the following steps:

A piezoelectric layer 2321 located on the substrate 2310 is formed;

A groove 2321a located in the upper surface of the piezoelectric layer 2321 is formed;

An electrode layer 2323 located in the groove 2321a is formed, wherein the thickness of the electrode layer 2323 is equal to the depth of the groove 2321a;

A sacrificial layer 2325 located on the electrode layer 2323 is formed, wherein the substrate 2321 and the sacrificial layer 2325 are respectively located on two sides of the piezoelectric layer 2321; and An intermediate layer 2327 which is located on the piezoelectric layer 2321 and the electrode layer 2323 and covers the sacrificial layer 2325 is formed, wherein the first side 2320a corresponds to the piezoelectric layer 2321, and the second side 2320b corresponds to the intermediate layer 2327.

In this embodiment, the sacrificial layer 2325 is made of, but not limited to, at least one of the following materials: polymer, silicon dioxide, doped silicon dioxide and polysilicon. In this embodiment, the polymer includes, but is not limited to, at least one of benzocyclobutene (BCB), photosensitive epoxy resin photoresist (such as SU-8) and polyimide. It should be noted that the doped silicon dioxide is silicon dioxide doped with other elements.

In this embodiment, the intermediate layer 2327 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the intermediate layer 2327 and the sacrificial layer 2325 are made of different materials.

Figure 24:
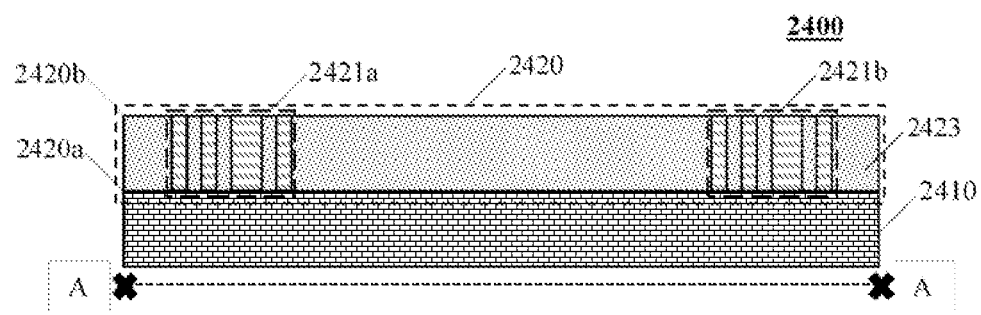

As shown in FIG. 24, the formation method of the filter device further comprises: a sixth layer is formed through the following steps:

A substrate 2410 is provided; and

An IPD 2420 is formed, wherein the IPD has a third side 2420a and a fourth side 2420b, and the substrate 2410 is located on the third side 2420a.

In this embodiment, the substrate 2410 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the IPD 2420 is formed through the following steps:

A spiral inductor 2421a and a spiral inductor 2421b which are located on the substrate 2410 are formed; and An intermediate layer 2423 located on the substrate 2410 is formed, wherein the spiral inductor 2421a and the spiral inductor 2421b are inlaid in the intermediate layer 2423.

In this embodiment, the thickness of the spiral inductor 2421a is equal to that of the intermediate layer 2423. In this embodiment, the thickness of the spiral inductor 2421b is equal to that of the intermediate layer 2423. In another embodiment, the thickness of the spiral inductor may be different from that of the intermediate layer.

In this embodiment, the spiral inductor 2421a and the spiral inductor 2421b are formed through a semiconductor process. It should be noted that the spiral inductors in this embodiments are merely specific examples which are not intended to limit the invention, and inductors manufactured through other semiconductor processes known by those skilled in the art can be applied to the embodiments of the invention.

In this embodiment, the intermediate layer 2423 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

Figure 25:
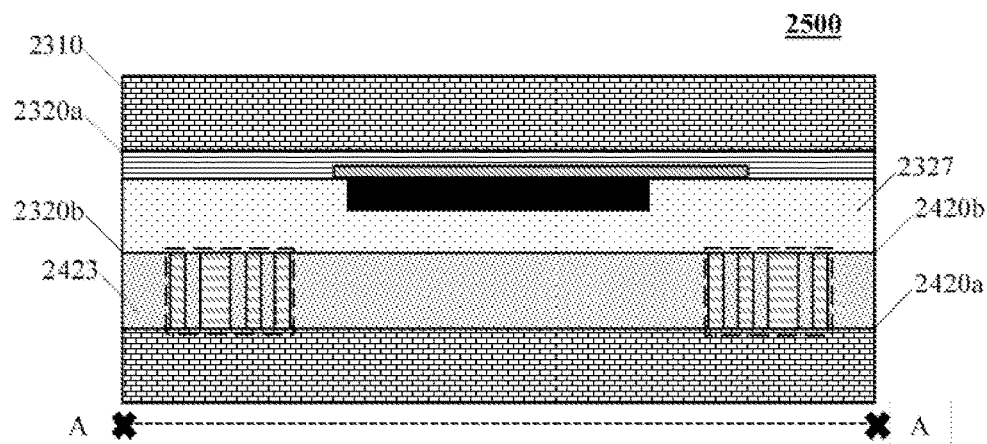

As shown in FIG. 25, the formation method of the filter device further comprises: the fifth layer and the sixth layer are connected.

In this embodiment, the fifth layer and the sixth layer are connected through the following step: the intermediate layer 2327 and the intermediate layer 2423 are connected, wherein the intermediate layer 2327 is located on the fourth side 2420b, and the intermediate layer 2423 is located on the second side 2320b.

It should be noted that any connecting processes (such as the bonding process) known by those skilled in the art can be applied to the embodiments of the invention.

Figure 26A:
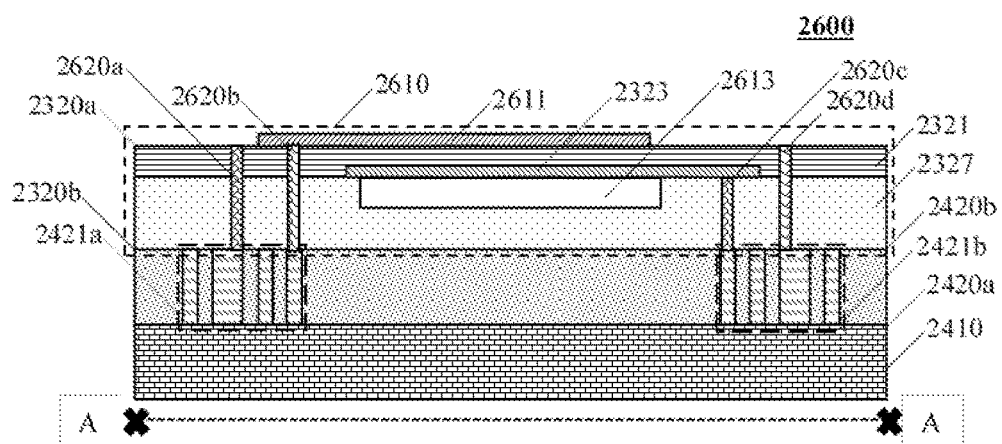

As shown in FIG. 26a, the formation method of the filter device further comprises:

The substrate 2310 is removed; and

A BAW resonance device 2610 located on the fourth side 2420b is formed based on the resonance device preprocessing layer 2320.

It should be noted that the substrate 2410, the spiral inductor 2421a, the spiral inductor 2421b and the BAW resonance device 2610 are located in a die.

In this embodiment, the BAW resonance device 2610 is formed through the following steps:

An electrode layer 2611 which is located on the first side 2320a and contacts with the piezoelectric layer 2321 is formed, wherein the electrode layer 2323 and the electrode layer 2611 are respectively located on two sides of the piezoelectric layer 2321; and A cavity 2613 is formed based on the sacrificial layer 2325, wherein the electrode layer 2323 covers the cavity 2613, a resonance region (namely, an overlap region between the electrode layer 2323 and the electrode layer 2611) is located over the cavity 2613 and overlaps with the intermediate layer 2327, and an overlap part is located on one side of the cavity 2613.

In this embodiment, the formation method of the filter device further comprises: a through hole 2620a and a through hole 2620b are formed based on the spiral inductor 2421a, and a through hole 2620c and a through hole 2620d are formed based on the spiral inductor 2421b, wherein the electrode layer 2611 is connected to an input terminal and is electrically connected to a first terminal of the spiral inductor 2421a via the through hole 2620b, a second terminal of the spiral inductor 2421a is grounded via the through hole 2620a, the electrode layer 2323 is electrically connected to a first terminal of the spiral inductor 2421b via the through hole 2520c and is connected to an output terminal, and a second terminal of the spiral inductor 2421b is grounded via the through hole 2620d.

Figure 26B:
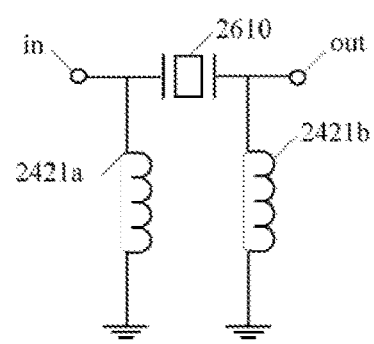
FIG. 26b is an equivalent circuit diagram of a filter device 2600.

As shown in FIG. 26b, an equivalent circuit diagram of the filter device 2600 comprises the BAW resonance device 2610, the spiral inductor 2421a and the spiral inductor 2421b, wherein the first terminal of the spiral inductor 2421a is connected to an input terminal in and is electrically connected to a first terminal of the resonance device 2610, the second terminal of the spiral inductor 2421a is grounded, the first terminal of the resonance device 2610 is also connected to the input terminal in, a second terminal of the resonance device 2610 is electrically connected to the first terminal of the spiral inductor 2421b and is electrically connected to an output terminal out, the first terminal of the spiral inductor 2421b is also connected to the output terminal out, and the second terminal of the spiral inductor 2421b is grounded.

It should be noted that an RF filter device formed by integrating the resonance device (such as an SAW resonance device or a BAW resonance device) and a passive device (such as an IPD) in one die can optimize the pass-band width, has a high out-of-band rejection, and occupies less space in an RF front-end chip.

In addition, compared with electrical connection of one resonance device and one passive device, the integration of the resonance device and the passive device in one die can reduce electrical transmission losses, thus improving the filter performance.

FIG. 27-FIG. 30a are structural diagrams of cross-section A for a formation method of a filter device in an embodiment of the invention.

Figure 27:
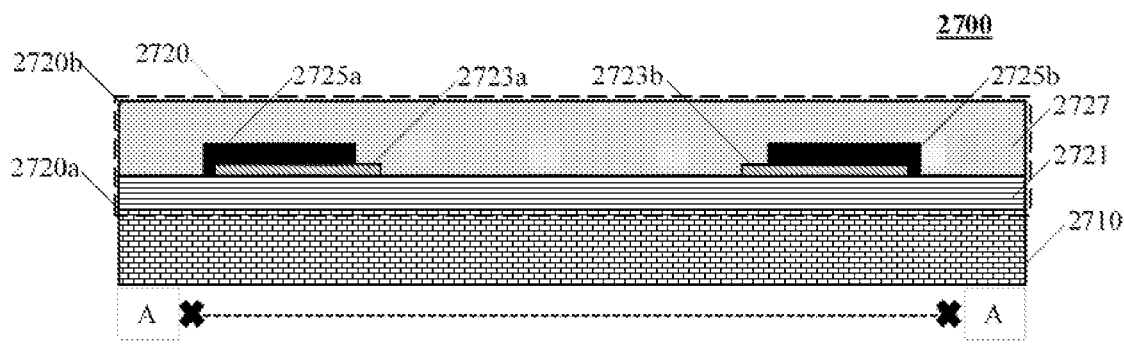

As shown in FIG. 27, the formation method of the filter device comprises: a fifth layer is formed through the following steps:

A substrate 2710 is provided; and

A resonance device preprocessing layer 2720 for forming at least one resonance device is formed, wherein the resonance device preprocessing layer 2720 has a first side 2720a and a second side 2720b, and the substrate 2710 is located on the first side 2720a.

In this embodiment, the substrate 2710 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the resonance device preprocessing layer 2720 is formed through the following steps:

A piezoelectric layer 2721 located on the substrate 2710 is formed;

An electrode layer 2723a and an electrode layer 2723b which are located on the piezoelectric layer 2721 are formed;

A sacrificial layer 2725a which is located on the piezoelectric layer 2721 and covers a first terminal of the electrode layer 2723a is formed;

A sacrificial layer 2725b which is located on the piezoelectric layer 2721 and covers a first terminal of the electrode layer 2723b is formed; and An intermediate layer 2727 which is located on the piezoelectric layer 2721 and covers the sacrificial layer 2725a, the sacrificial layer 2725b, the electrode layer 2723a and the electrode layer 2723b is formed, wherein the first side 2720a corresponds to the piezoelectric layer 2721, and the second side 2720b corresponds to the intermediate layer 2727.

In this embodiment, the intermediate layer 2727 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

Figure 28:
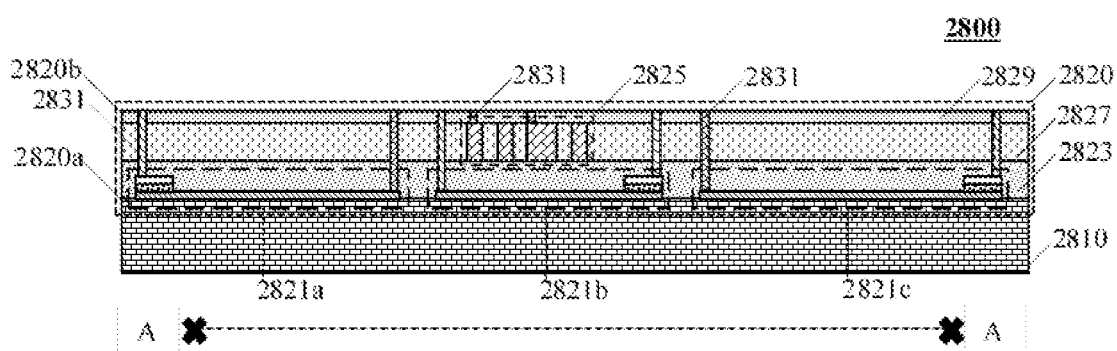

As shown in FIG. 28, the formation method of the filter device further comprises: a sixth layer is formed through the following steps:

A substrate 2810 is provided; and

An IPD 2820 is formed, wherein the IPD 2820 has a third side 2820a and a fourth side 2820b, and the substrate 2810 is located on the third side 2820a.

In this embodiment, the substrate 2810 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the IPD 2820 is formed through the following steps:

An MIM capacitor 2821a, an MIM capacitor 2821b and an MIM capacitor 2821c which are located on the substrate 2810 are formed;

An intermediate layer 2823 which is located on the substrate 2810 and covers the MIM capacitor 2821a, the MIM capacitor 2821b and the MIM capacitor 2821c is formed;

A spiral inductor 2825 located on the intermediate layer 2823 is formed;

An intermediate layer 2827 located on the intermediate layer 2823 is formed, wherein the spiral inductor 2825 is inlaid in the intermediate layer 2827;

An intermediate layer 2829 which is located on the intermediate layer 2827 and covers the spiral inductor 1825 is formed; and Multiple through holes 2831 which are inlaid in the IPD 2820 and respectively connected to the MIM capacitor 2821a, the MIM capacitor 2821b, the MIM capacitor 2821c and the spiral inductor 2825 are formed.

In this embodiment, the MIM capacitor 2821a, the MIM capacitor 2821b and the MIM capacitor 2821c are formed through a semiconductor process. It should be noted that the MIM capacitors in this embodiment are merely specific examples which are not intended to limit the invention, and capacitors manufactured through other semiconductor processes known by those skilled in the art, such as MOM capacitors, can also be applied to the embodiments of the invention.

In this embodiment, the intermediate layer 2823 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the spiral inductor 2825 is formed through a semiconductor process. It should be noted that the spiral inductor in this embodiment is merely a specific example which is not intended to limit the invention, and inductors manufactured through other semiconductor processes known by those skilled in the art can also be applied to the embodiments of the invention.

In this embodiment, the intermediate layer 2827 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the thickness of the spiral inductor 2825 is equal to that of the intermediate layer 2827. In another embodiment, the thickness of the spiral inductor may be different from that of the intermediate layer.

In this embodiment, the intermediate layer 2829 and the intermediate layer 2727 are made of the same material. In this embodiment, the intermediate layer 2829 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

Figure 29:
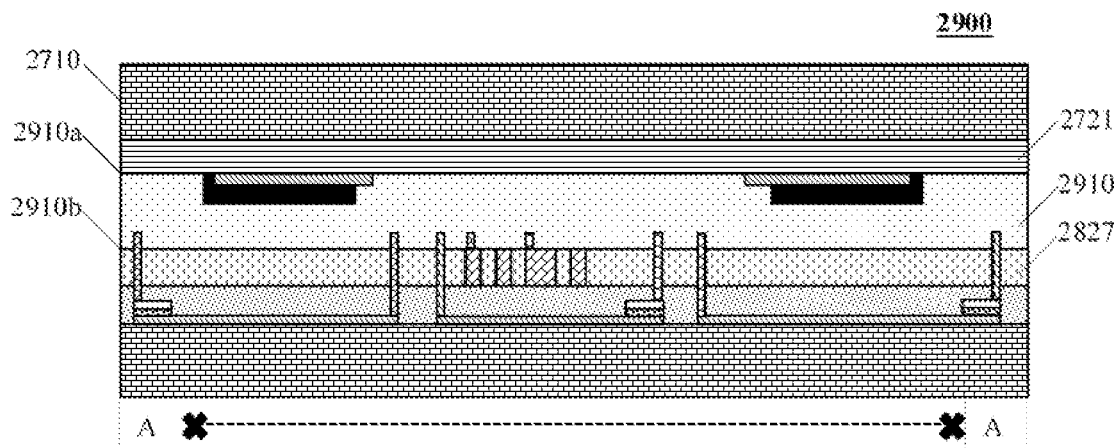

As shown in FIG. 29, the formation method of the filter device further comprises: the fifth layer and the sixth layer are connected.

In this embodiment, the fifth layer and the sixth layer are connected through the following step: the intermediate layer 2727 and the intermediate layer 2829 are bonded to form an intermediate layer 2910, wherein the intermediate layer 2910 has a fifth side 2910a and a sixth side 2910b, the piezoelectric layer 2721 is located on the fifth side 2910a, and the intermediate layer 2827 is located on the sixth side 2910b.

In this embodiment, the intermediate layer 2910 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In another embodiment, the two intermediate layers bonded together may be made of different materials.

It should be noted that any bonding processes known by those skilled in the art can be applied to the embodiments of the invention.

Figure 30A:
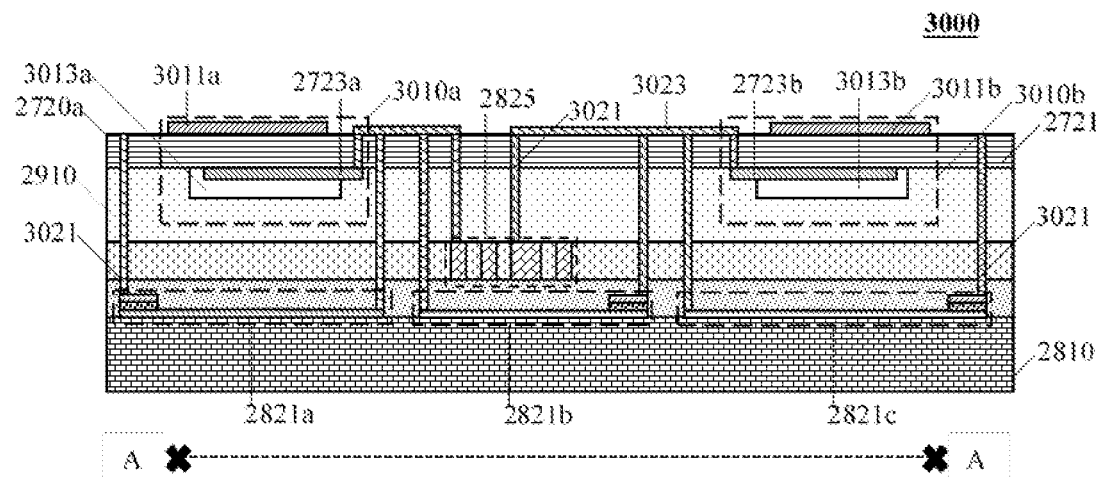

As shown in FIG. 30a, the formation method of the filter device further comprises:

The substrate 2710 is removed; and

A BAW resonance device 3010a and a BAW resonance device 3010b are formed based on the resonance device preprocessing layer 2720.

It should be noted that the substrate 2810, the MIM capacitor 2821a, the MIM capacitor 2821b, the MIM capacitor 2821c, the spiral inductor 2825, the BAW resonance device 3010a and the BAW resonance device 3010b are located in a die.

In this embodiment, the BAW resonance device 3010a is formed through the following steps:

An electrode layer 3011a which is located on the first side 2720a and contacts with the piezoelectric layer 2721 is formed, wherein the electrode layer 2723a and the electrode layer 3011a are respectively located on two sides of the piezoelectric layer 2721; and A cavity 3013a is formed based on the sacrificial layer 2725a, wherein a resonance region (namely, an overlap region of the electrode layer 2723a and the electrode layer 3011a) is suspended with respect to the cavity 3013a and does not overlap with the intermediate layer 2910.

In this embodiment, the BAW resonance device 3010b is formed through the following steps:

An electrode layer 3011b which is located on the first side 2720a and contacts with the piezoelectric layer 2721 is formed, wherein the electrode layer 2723b and the electrode layer 3011b are respectively located on two sides of the piezoelectric layer 2721; and A cavity 3013b is formed based on the sacrificial layer 2725b, wherein a resonance region (namely, an overlap region of the electrode layer 2723b and the electrode layer 3011b) is suspended with respect to the cavity 3013b and does not overlap with the intermediate layer 2910.

In this embodiment, the formation method of the filter device further comprises: multiple through holes 3021 are formed based on the multiple through holes 2831, and multiple wires 3023 are formed based on the multiple through holes 3021, wherein the electrode layer 3011 is connected to an input terminal; the electrode layer 2733a is electrically connected to a first terminal of the MIM capacitor 2821a, a first terminal of the MIM capacitor 2821b, and a first terminal of the spiral inductor 2825 via the wires 3023 and the multiple through holes 3021; a second terminal of the MIM capacitor 2821a is grounded via the corresponding through hole 3021; a second terminal of the MIM capacitor 2821b and a second terminal of the spiral inductor 2825 are electrically connected to the electrode layer 2723b via the wires 2023 and the multiple through holes 3021; a first terminal of the electrode layer 2723b and a first terminal of the MIM capacitor 2821c are electrically connected via the multiple wires 3023 and the multiple through holes 3021; a second terminal of the MIM capacitor 2821c is grounded via the corresponding through hole 3021; and the electrode layer 3011b is connected to an output terminal.

Figure 30B:
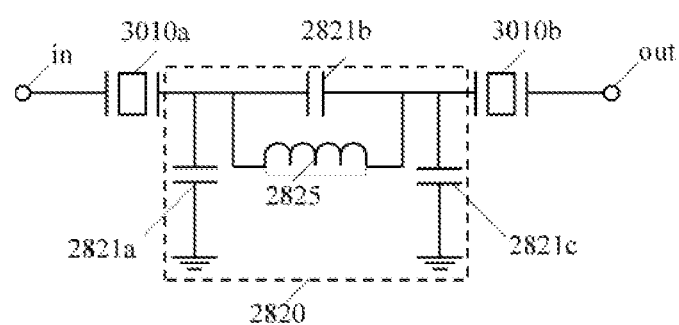
FIG. 30b is an equivalent circuit diagram of a filter device 3000.

As shown in FIG. 30b, an equivalent circuit diagram of the filter device 3000 comprises the BAW resonance device 3010a, the BAW resonance device 3010b, the MIM capacitor 2821a, the MIM capacitor 2821b, the MIM capacitor 2821c and the spiral inductor 2825, wherein a first terminal of the BAW resonance device 3010a is connected to an input terminal; a second terminal of the BAW resonance device 3010a is electrically connected to the first terminal of the MIM capacitor 2821a, the first terminal of the MIM capacitor 2821b and the first terminal of the spiral inductor 2825; the first terminal of the MIM capacitor 2821a is electrically connected to the first terminal of the MIM capacitor 2821b and the first terminal of the spiral inductor 2825; the second terminal of the MIM capacitor 2821a is grounded; the first terminal of the MIM capacitor 2821b is electrically connected to the first terminal of the spiral inductor 2825; the second terminal of the MIM capacitor 2821b is electrically connected to the second terminal of the spiral inductor 2825, the first terminal of the MIM capacitor 2821c and a first terminal of the BAW resonance device 3010b; the second terminal of the spiral inductor 2825 is electrically connected to the first terminal of the MIM capacitor 2821c and the first terminal of the BAW resonance device 3010b; the first terminal of the MIM capacitor 2821c is electrically connected to the first terminal of the BAW resonance device 3010b; the second terminal of the MIM capacitor 2821c is grounded; and a second terminal of the BAW resonance device 3010b is connected to an output terminal out.

In this embodiment, an equivalent circuit of the IPD 2820 formed by the MIM capacitor 2821a, the MIM capacitor 2821b, the MIM capacitor 2821c and the spiral inductor 2825 is a band-pass filter circuit. In another embodiment, the equivalent circuit of the IPD includes, but is not limited to, at least one of a low-pass filter circuit, a high-pass filter circuit and a band-stop filter circuit.

It should be noted that the circuit in this embodiment is merely a specific example which is not intended to limit the invention, and the embodiments of the invention may also adopt other circuits known by those skilled in the art.

It should be noted that an RF filter device formed by integrating a resonance device (such as an SAW resonance device or a BAW resonance device) and a passive device (such as an IPD) in one die can optimize the pass-band width, has a high out-of-band rejection, and occupies less space in an RF front-end chip.

In addition, compared with electrical connection of one resonance device and one passive device, the integration of the resonance device and the passive device in one die can reduce electrical transmission losses, thus improving the filter performance.

To obtain a better understanding of the aforementioned beneficial effects of the invention, an illustrative description is given below with reference to FIG. 31.

Figure 31:
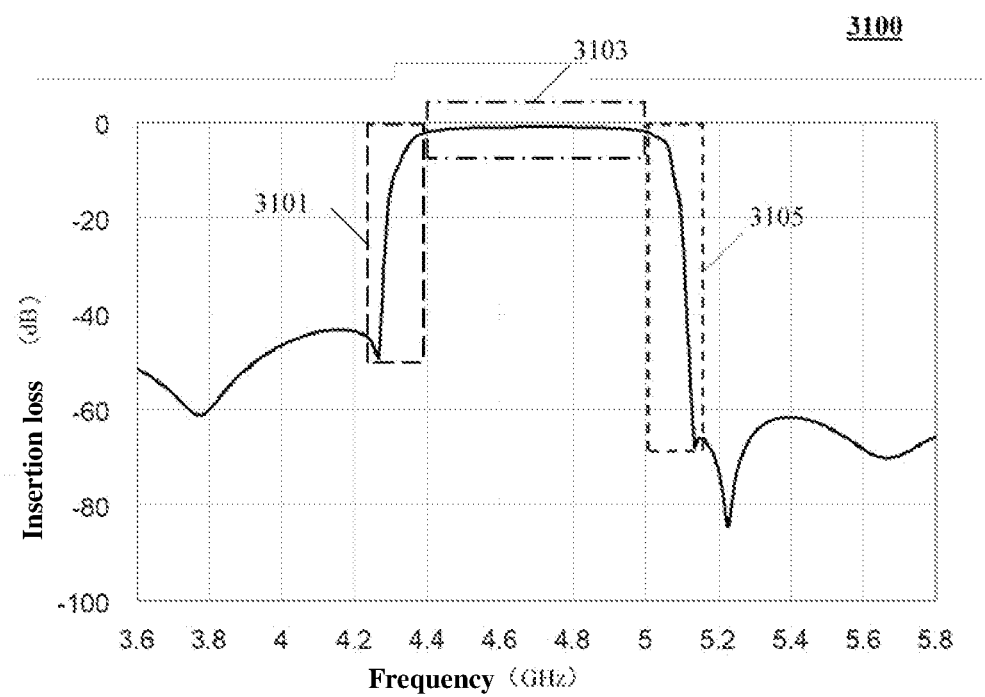
FIG. 31 is a performance diagram 3100 of a filter device formed by an embodiment of the invention.

As shown in FIG. 31, a performance diagram 3100 of the filter device formed by the embodiments of the invention includes an insertion loss curve, wherein the horizontal axis of the insertion loss curve represents the frequency (unit: GHz), and the vertical axis of the insertion loss curve represents the insertion loss (unit: dB). The filter device comprises a first resonance device (such as the BAW resonance device 3010a in FIG. 30), a band-pass filter device (such as the IPD 2820 in FIG. 30), and a second resonance device (such as the BAW resonance device 3010b in FIG. 30), wherein the first resonance device, the band-pass filter device and the second resonance device are integrated in a die. The insertion loss curve includes a first out-of-band rejection region 3101, a band-pass region 3103 and a second out-of-band rejection region 3105, wherein the first out-of-band rejection region 3101 is mainly based on the first resonance device, the band-pass region 3101 is mainly based on the band-pass filter device, and the second out-of-band region 3105 is mainly based on the second resonance device. Wherein, the first out-of-band rejection region 3101 has a high out-of-band rejection, and the second out-of-band rejection region 3105 also has a high out-of-band rejection.

It should be noted that the filter device can be applied to 5G n97 band (4.4 to 5 GHz) on the basis of the insertion loss curve.

To sum up, an RF filter device formed by integrating a resonance device (such as an SAW resonance device or a BAW resonance device) and a passive device (IPD) in one die can optimize the pass-band width, has a high out-of-band rejection, and occupies less space in an RF front-end chip.

In addition, compared with electrical connection of one resonance device and one passive device, the integration of the resonance device and the passive device in one die can reduce electrical transmission losses, thus improving the filter performance.

It should be understood that the examples and embodiments in this specification are merely illustrative ones, and various modifications and amendments can be made by those skilled in the art without departing from the spirit and scope defined by this application and the appended claims.

The invention claimed is:

1. A formation method of a filter device, comprising:
    forming a first layer through the following steps: providing a first substrate, and forming a resonance device preprocessing layer, wherein the resonance device preprocessing layer has a first side and a second side opposite to the first side, and the first substrate is located on the first side, and wherein the step of forming the resonance device preprocessing layer comprises: forming an active preprocessing layer which is located on the first substrate, and forming a reflection preprocessing layer which is located on the active preprocessing layer, wherein the first side corresponds to the active preprocessing layer, and the second side corresponds to the reflection preprocessing layer;

forming a second layer through the following steps: providing a second substrate, and forming a first passive device, wherein the first passive device has a third side and a fourth side opposite to the third side, and the second substrate is located on the third side;

connecting the first layer and the second layer, wherein the first layer is located on the fourth side, and the second layer is located on the second side;

removing the first substrate; and forming at least one first resonance device based on the resonance device preprocessing layer.

2. The formation method of the filter device according to claim 1, wherein the second substrate, the first passive device and the at least one first resonance device are located in a die.

3. The formation method of the filter device according to claim 1, wherein the at least one first resonance device is electrically connected to the first passive device.

4. The formation method of the filter device according to claim 1, wherein step of forming the first passive device comprises: forming at least one of a capacitor, an inductor, a resistor and a through hole.

5. The formation method of the filter device according to claim 1, wherein the first passive device includes a first integrated passive device (IPD) which is formed through a semiconductor process.

6. The formation method of the filter device according to claim 1, wherein the step of connecting the first layer and the second layer comprises: connecting the resonance device preprocessing layer and the first passive device.

7. The formation method of the filter device according to claim 1, wherein the at least one first resonance device includes at least one of a surface acoustic wave (SAW) resonance device and a bulk acoustic wave (BAW) resonance device.

8. The formation method of the filter device according to claim 1, wherein the step of connecting the first layer and the second layer comprises: connecting the reflection preprocessing layer and the first passive device.

9. The formation method of the filter device according to claim 1, wherein the step of forming at least one first resonance device comprises: forming a first active layer of the at least one first resonance device based on the active preprocessing layer, and forming a first reflection layer of the at least one first resonance device based on the reflection preprocessing layer to reflect acoustic waves generated by the first active layer.

10. The formation method of the filter device according to claim 1, wherein the step of forming the active preprocessing layer comprises: forming a first piezoelectric layer which is located on the first substrate, and forming a first electrode layer which is located on the first piezoelectric layer, wherein the first side corresponds to the first piezoelectric layer.

11. The formation method of the filter device according to claim 10, wherein the step of forming at least one first resonance device comprises: forming a second electrode layer which is located on the first side and contacts with the first piezoelectric layer, wherein the first electrode layer and the second electrode layer are respectively located on two sides of the first piezoelectric layer to form a second active layer of the at least one first resonance device; and forming a second reflection layer of the at least one first resonance device based on the reflection preprocessing layer to reflect acoustic waves generated by the second active layer.

12. The formation method of the filter device according to claim 1, wherein the step of forming the reflection preprocessing layer comprises: forming a first sacrificial layer which is located on the active preprocessing layer, and forming a first intermediate layer which is located on the active preprocessing layer and at least covers the first sacrificial layer, wherein the second side corresponds to the first intermediate layer.

13. The formation method of the filter device according to claim 12, wherein the first intermediate layer is made of at least one of the following materials: polymer, insulating dielectric and polysilicon.

14. The formation method of the filter device according to claim 12, wherein the step of connecting the first layer and the second layer comprises: connecting the first intermediate layer and the first passive device.

15. The formation method of the filter device according to claim 12, wherein the step of forming at least one first resonance device comprises: forming a third active layer of the at least one first resonance device based on the active preprocessing layer, and removing the first sacrificial layer to form a first cavity of the at least one first resonance device to reflect acoustic waves generated by the third active layer.

16. The formation method of the filter device according to claim 12, wherein the step of forming the second layer further comprises: forming a second intermediate layer which is located on the fourth side.

17. The formation method of the filter device according to claim 16, wherein the second intermediate layer is made of at least one of the following materials: polymer, insulating dielectric and polysilicon.

18. The formation method of the filter device according to claim 16, wherein the step of connecting the first layer and the second layer comprises: bonding the first intermediate layer and the second intermediate layer to form a third intermediate layer.

* * * * *